(12) United States Patent
Nikkel et al.

(10) Patent No.: US 9,385,684 B2
(45) Date of Patent: Jul. 5, 2016

(54) ACOUSTIC RESONATOR HAVING GUARD RING

(71) Applicant: Avago Technologies General IP (Singapore) Pte. Ltd., Singapore (SG)

(72) Inventors: Phil Nikkel, Loveland, CO (US); Chris Feng, Fort Collins, CO (US); Dariusz Burak, Fort Collins, CO (US); John Choy, Westminster, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 637 days.

(21) Appl. No.: 13/658,024

(22) Filed: Oct. 23, 2012

(65) Prior Publication Data

US 2014/0111288 A1  Apr. 24, 2014

(51) Int. Cl.
*H03H 9/02* (2006.01)
*H03H 9/17* (2006.01)

(52) U.S. Cl.
CPC ....... *H03H 9/02118* (2013.01); *H03H 9/02157* (2013.01); *H03H 9/173* (2013.01)

(58) Field of Classification Search
CPC  H03H 9/02118; H03H 9/173; H03H 9/02157
USPC ........... 333/133, 186–191; 310/324, 365, 312
See application file for complete search history.

(56) References Cited

U.S. PATENT DOCUMENTS

| | | |
|---|---|---|
| 4,633,285 A | 12/1986 | Hunsinger et al. |
| 4,916,520 A | 4/1990 | Kurashima |
| 4,933,743 A | 6/1990 | Thomas et al. |
| 5,006,478 A | 4/1991 | Kobayashi et al. |
| 5,087,959 A | 2/1992 | Omori et al. |
| 5,587,620 A | 12/1996 | Ruby et al. |
| 5,698,928 A | 12/1997 | Mang et al. |
| 5,817,446 A | 10/1998 | Lammert |
| 5,825,092 A | 10/1998 | Eelgado et al. |
| 5,873,153 A | 2/1999 | Ruby et al. |
| 6,107,721 A | 8/2000 | Lakin |
| 6,424,237 B1 * | 7/2002 | Ruby et al. ............ 333/187 |
| 6,507,983 B1 | 1/2003 | Ruby et al. |
| 6,607,934 B2 | 8/2003 | Chang et al. |
| 7,199,683 B2 | 4/2007 | Thalhammer et al. |
| 7,280,007 B2 | 10/2007 | Feng et al. |
| 7,345,410 B2 | 3/2008 | Grannen et al. |
| 7,358,831 B2 | 4/2008 | Larson, III et al. |

(Continued)

FOREIGN PATENT DOCUMENTS

| | | |
|---|---|---|
| CN | 101170303 | 4/2008 |
| EP | 0880227 | 11/1998 |

(Continued)

OTHER PUBLICATIONS

Co-pending U.S. Appl. No. 13/101,376, filed May 5, 2011.

(Continued)

*Primary Examiner* — Benny Lee
*Assistant Examiner* — Jorge Salazar, Jr.

(57) ABSTRACT

A bulk acoustic wave (BAW) resonator structure comprises a first electrode disposed over a substrate, a piezoelectric layer disposed over the first electrode, a second electrode disposed over the first piezoelectric layer, and a guard ring structure formed around a perimeter of an active region corresponding to an overlap of the first electrode, the first piezoelectric layer, and the second electrode.

45 Claims, 16 Drawing Sheets

(56) References Cited

U.S. PATENT DOCUMENTS

| | | |
|---|---|---|
| 7,377,168 B2 | 5/2008 | Liu |
| 7,388,454 B2 | 6/2008 | Ruby et al. |
| 7,629,865 B2 | 12/2009 | Ruby |
| 7,642,693 B2 | 1/2010 | Akiyama et al. |
| 7,889,024 B2 | 2/2011 | Bradley et al. |
| 8,507,919 B2 | 8/2013 | Ishikura |
| 2001/0026951 A1 | 10/2001 | Vergani et al. |
| 2003/0132493 A1 | 7/2003 | Kang et al. |
| 2003/0155574 A1 | 8/2003 | Doolittle |
| 2004/0056735 A1 | 3/2004 | Nomura et al. |
| 2004/0092234 A1 | 5/2004 | Pohjonen |
| 2004/0099898 A1 | 5/2004 | Grivna et al. |
| 2004/0124952 A1 | 7/2004 | Tikka |
| 2004/0129079 A1 | 7/2004 | Kato et al. |
| 2004/0150293 A1 | 8/2004 | Unterberger |
| 2004/0150296 A1 | 8/2004 | Park et al. |
| 2004/0166603 A1 | 8/2004 | Carley |
| 2004/0195937 A1 | 10/2004 | Matsubara et al. |
| 2004/0212458 A1 | 10/2004 | Lee |
| 2004/0246075 A1 | 12/2004 | Bradley et al. |
| 2004/0257171 A1 | 12/2004 | Park et al. |
| 2004/0257172 A1 | 12/2004 | Schmidhammer et al. |
| 2004/0263287 A1 | 12/2004 | Ginsburg et al. |
| 2005/0012570 A1 | 1/2005 | Korden et al. |
| 2005/0012716 A1 | 1/2005 | Mikulin et al. |
| 2005/0023931 A1 | 2/2005 | Bouche et al. |
| 2005/0030126 A1 | 2/2005 | Inoue et al. |
| 2005/0036604 A1 | 2/2005 | Scott et al. |
| 2005/0057117 A1 | 3/2005 | Nakatsuka et al. |
| 2005/0057324 A1 | 3/2005 | Onishi et al. |
| 2005/0068124 A1 | 3/2005 | Stoemmer |
| 2005/0082626 A1 | 4/2005 | Leedy |
| 2005/0093396 A1 | 5/2005 | Larson, III et al. |
| 2005/0093653 A1 | 5/2005 | Larson, III |
| 2005/0093654 A1 | 5/2005 | Larson, III et al. |
| 2005/0093655 A1 | 5/2005 | Larson, III et al. |
| 2005/0093657 A1 | 5/2005 | Larson, III et al. |
| 2005/0093658 A1 | 5/2005 | Larson, III et al. |
| 2005/0093659 A1 | 5/2005 | Larson, III et al. |
| 2005/0104690 A1 | 5/2005 | Larson, III et al. |
| 2005/0110598 A1 | 5/2005 | Larson, III |
| 2005/0128030 A1 | 6/2005 | Larson, III et al. |
| 2005/0140466 A1 | 6/2005 | Larson, III et al. |
| 2005/0167795 A1 | 8/2005 | Higashi |
| 2005/0193507 A1 | 9/2005 | Ludwiczak |
| 2005/0206271 A1 | 9/2005 | Higuchi et al. |
| 2005/0206483 A1 | 9/2005 | Pashby et al. |
| 2005/0275486 A1 | 12/2005 | Feng et al. |
| 2006/0081048 A1 | 4/2006 | Mikado et al. |
| 2006/0087199 A1 | 4/2006 | Larson, III et al. |
| 2006/0103492 A1 | 5/2006 | Feng et al. |
| 2006/0119453 A1 | 6/2006 | Fattinger et al. |
| 2006/0121686 A1 | 6/2006 | Wei et al. |
| 2006/0125489 A1 | 6/2006 | Feucht et al. |
| 2006/0132262 A1 | 6/2006 | Fazzio et al. |
| 2006/0160353 A1 | 7/2006 | Gueneau de Mussy et al. |
| 2006/0164183 A1 | 7/2006 | Tikka et al. |
| 2006/0185139 A1 | 8/2006 | Larson, III et al. |
| 2006/0197411 A1 | 9/2006 | Hoen et al. |
| 2006/0238070 A1 | 10/2006 | Costa et al. |
| 2006/0284707 A1 | 12/2006 | Larson, III et al. |
| 2006/0290446 A1 | 12/2006 | Aigner et al. |
| 2007/0035364 A1 | 2/2007 | Sridhar et al. |
| 2007/0080759 A1 | 4/2007 | Jamneala et al. |
| 2007/0084964 A1 | 4/2007 | Sternberger |
| 2007/0085213 A1 | 4/2007 | Anh et al. |
| 2007/0085447 A1 | 4/2007 | Larson, III et al. |
| 2007/0085631 A1 | 4/2007 | Larson, III et al. |
| 2007/0085632 A1 | 4/2007 | Larson, III et al. |
| 2007/0086080 A1 | 4/2007 | Larson, III et al. |
| 2007/0086274 A1 | 4/2007 | Nishimura et al. |
| 2007/0090892 A1 | 4/2007 | Larson, III et al. |
| 2007/0170815 A1 | 7/2007 | Unkrich |
| 2007/0171002 A1 | 7/2007 | Unkrich |
| 2007/0176710 A1 | 8/2007 | Jamneala et al. |
| 2007/0205850 A1 | 9/2007 | Jamneala et al. |
| 2008/0051039 A1* | 2/2008 | Iwasaki et al. .................. 455/73 |
| 2008/0055020 A1 | 3/2008 | Handtmann et al. |
| 2008/0297279 A1 | 12/2008 | Thalhammer et al. |
| 2008/0297280 A1 | 12/2008 | Thalhammer et al. |
| 2009/0064498 A1 | 3/2009 | Mok et al. |
| 2009/0096550 A1 | 4/2009 | Handtmann et al. |
| 2010/0052176 A1 | 3/2010 | Kamada et al. |
| 2010/0102358 A1 | 4/2010 | Lanzieri et al. |
| 2010/0148637 A1 | 6/2010 | Satou |
| 2010/0327697 A1 | 12/2010 | Choy et al. |
| 2010/0327994 A1 | 12/2010 | Choy et al. |
| 2011/0092067 A1 | 4/2011 | Bonilla et al. |
| 2011/0266917 A1 | 11/2011 | Metzger et al. |
| 2012/0218055 A1 | 8/2012 | Burak |
| 2012/0218056 A1 | 8/2012 | Burak |
| 2012/0248941 A1 | 10/2012 | Shirakawa et al. |
| 2013/0003377 A1 | 1/2013 | Sakai et al. |
| 2013/0221454 A1 | 8/2013 | Dunbar et al. |
| 2013/0334625 A1 | 12/2013 | Lin |

FOREIGN PATENT DOCUMENTS

| | | |
|---|---|---|
| JP | 10173479 | 6/1998 |
| JP | 2003-017964 | 1/2003 |
| KR | 2002-0050729 | 6/2002 |
| KR | 1020030048917 | 6/2003 |
| WO | WO-9937023 | 7/1999 |
| WO | WO2005/043752 | 5/2005 |

OTHER PUBLICATIONS

Co-pending U.S. Appl. No. 13/161,946, filed Jun. 16, 2011.
Co-pending U.S. Appl. No. 13/286,038, filed Oct. 31, 2011.
Lynch, A.C. "Precise Measurements on Dielectric and Magnetic Materials", IEEE Transactions on Instrumentation and Measurement, vol. IM-23, No. 4, Dec. 1974, p. 425-431.
Machine translation of JP2003-017964.

* cited by examiner

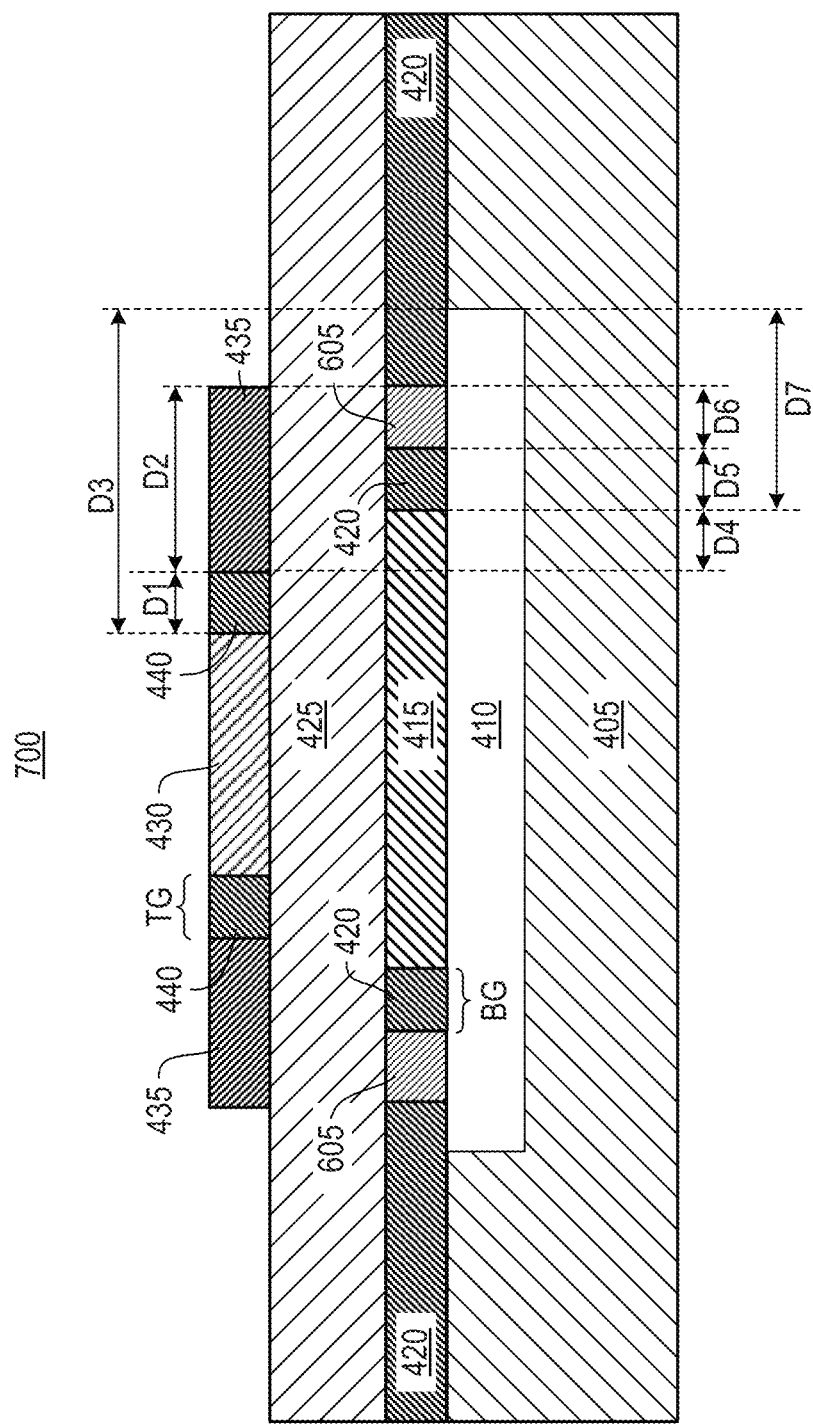

ACOUSTIC RESONATOR HAVING GUARD RING

BACKGROUND

Acoustic resonators can be used to implement signal processing functions in various electronic applications. For example, some cellular phones and other communication devices use acoustic resonators to implement frequency filters for transmitted and/or received signals.

Several different types of acoustic resonators can be used according to different applications. For example, different applications may use bulk acoustic wave (BAW) resonators such as thin film bulk acoustic resonators (FBARs) or double bulk acoustic resonators (DBARs), or they may use solid mounted resonators (SMRs).

FIG. 1A is a cross-sectional view of an example acoustic resonator 100, and FIG. 1B is a top view of acoustic resonator 100. In FIG. 1B, a line A-A' indicates the location of the cross-sectional view shown in FIG. 1A.

As illustrated in FIG. 1A, acoustic resonator 100 comprises a piezoelectric layer 110 located between a bottom electrode 105 and a top electrode 115. The designations top electrode and bottom electrode are for convenience of explanation, and they do not represent any limitation with regard to the spatial arrangement, positioning, or orientation of acoustic resonator 100. As illustrated in FIG. 1B, acoustic resonator 100 is formed with a polygonal shape in which each side of the polygon has a different length from the other sides. This type of shape is referred to as an apodized shape, and is used to achieve desired acoustic characteristics in acoustic resonator 100. Although FIG. 1B shows only top electrode 115 with the apodized shape, other portions of acoustic resonator 100 may have a similar shape.

During typical operation, an electric field is applied between bottom and top electrodes 105 and 115. In response to this electrical field, the reciprocal or inverse piezoelectric effect causes acoustic resonator 100 to mechanically expand or contract depending on the polarization of the piezoelectric material, as indicated by an arrow in FIG. 1A. As the electrical field varies over time, an acoustic wave is generated in piezoelectric layer 110, and the acoustic wave propagates through acoustic resonator 100. For example, in some implementations, the acoustic wave propagates in parallel with the electric field as a longitudinal wave, or along the mechanical interfaces of acoustic resonator 100 as a lateral wave.

The longitudinal acoustic wave, usually called a piston mode, is electrically excited by a vertical electric field between electrode plates and has a form of laterally uniform motion with the boundaries of motion determined by an overlap of top and bottom electrodes and the piezoelectric material. Lateral acoustic waves, usually called lateral modes, are excited at the edges of the piston mode motion and facilitate continuity of appropriate mechanical displacements and stresses between electrically excited and non-excited regions. In general, lateral modes are specific forms of motion supported by a mechanical stack and have both longitudinal and shear components. The lateral modes can either propagate freely (so called propagating modes) or exponentially decay (so called evanescent and complex modes) from the point of excitation. These modes can be excited both by a lateral structural discontinuity (for example, at an interface between regions of different thicknesses in a membrane, or at the edge of a top or bottom electrode) or by electric field discontinuity (for example, at an edge of a top electrode where the electric field is terminated abruptly). The lateral modes generally have a deleterious impact on FBAR functionality. For longitudinal waves, where a thickness d of piezoelectric layer 110 and of the top and bottom electrodes equals an odd (1, 3, 5 . . . ) integer multiple of half the wavelength λ of the acoustic waves, resonance states and/or acoustic resonance vibrations will occur. Because each acoustic material has a different propagation velocity for the acoustic wave, the fundamental resonance frequency, i.e. the lowest resonance frequency $_{FRES}$, will then be inversely proportional to a weighted sum of all thicknesses of the resonator layers.

The piezoelectric properties and, therefore the resonance properties of an acoustic resonator depend on various factors, such as the piezoelectric material, the production method, the polarization impressed upon the piezoelectric material during manufacturing, and the size of the crystals, to name but a few.

FIG. 2 is a graph illustrating a logarithmic input impedance response versus frequency for an example acoustic resonator. As illustrated in FIG. 2, the input impedance of the example acoustic resonator exhibits a sharp negative-going (in logarithmic scale) peak from a series resonance at a lower frequency Fs, and a sharp positive-going (again, in logarithmic scale) peak from a parallel resonance at a higher frequency Fp.

FIGS. 3A through 3C are circuit diagrams illustrating electrical models of a BAW resonator such as an FBAR. The model of FIG. 3A is a modified Butterworth-Van Dyke model (MBVD) model. The frequency response of this model is a passband response, with frequency response for frequencies below the passband being attenuated by capacitances Cm and Co, and with frequency response for frequencies above the passband being attenuated by an inductance Lm. As illustrated in FIG. 3B, at series resistance, the BAW resonator can be modeled by a series-resonant combination of inductance Lm and capacitance Cm in series with a parasitic resistance Rs. As illustrated in FIG. 3C, at parallel resonance, the BAW resonator can be modeled by a parallel-resonant combination of inductance Lm and capacitance Co in parallel with a parasitic resistance Rp. Resistances Rs and Rp represent various heat losses and acoustic losses within the acoustic resonator.

An acoustic resonator can be employed in various types of electrical filters, such as radio frequency (RF) filters and microwave filters. In addition, acoustic resonators can be combined in various ways to produce a variety of filter configurations. The performance of an RF or microwave filter constructed with an acoustic resonator depends on the performance of the acoustic resonator, which can be expressed in terms of the resonator's parallel resistance Rp, series resistance Rs and its electromechanical coupling coefficient $Kt^2$.

Referring to FIGS. 2 and 3, the series resistance Rs is the smallest value of magnitude of input impedance, and series resonance frequency Fs is a frequency at which that minimum occurs. The parallel resistance Rp is the largest value of magnitude of input impedance, and parallel resonance frequency Fp is a frequency at which that maximum occurs. The electromechanical coupling coefficient $Kt^2$ is a normalized difference between parallel and series resonance frequencies Fp and Fs and is typically expressed as a percent value (%) of the series resonance frequency Fs. In general, devices with higher Rp or $Kt^2$ and lower Rs are considered to have superior performance than devices with higher Rs or lower Rp or lower $Kt^2$. Thus, other things being equal, it is desirable to provide a filter with an acoustic resonator having a higher Rp or $Kt^2$ and lower Rs.

An acoustic resonator can also be employed in an oscillator. Where an acoustic resonator is employed in an oscillator, the performance of the oscillator (e.g., phase noise) is affected by the Rp or $Kt^2$ of the acoustic resonator. Moreover, as with filters, it is also desirable to provide an oscillator with an acoustic resonator having a higher Rp or $Kt^2$ and lower Rs.

Unfortunately, many design choices that increase the Rp of an acoustic resonator tend to decrease the $Kt^2$ of the acoustic resonator, and vice versa. In other words, there is generally a tradeoff between Rp and $Kt^2$. Consequently, applications requiring high Rp may be required to sacrifice $Kt^2$, and applications requiring a high $Kt^2$ may be required to sacrifice Rp.

What is needed, therefore, are acoustic resonator structures that can provide appropriate values of Rp and electromechanical coupling coefficient $Kt^2$ according to the demands of different applications.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

FIG. 7A is a cross-sectional view of an FBAR according to another representative embodiment.

DETAILED DESCRIPTION

Figure 1A:
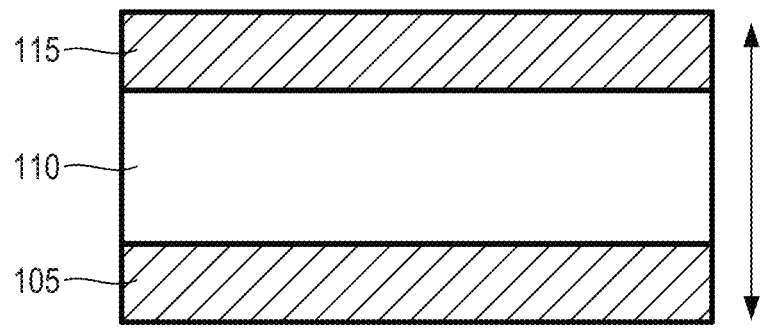
FIG. 1A is a cross-sectional view of an example acoustic resonator.
Figure 1B:
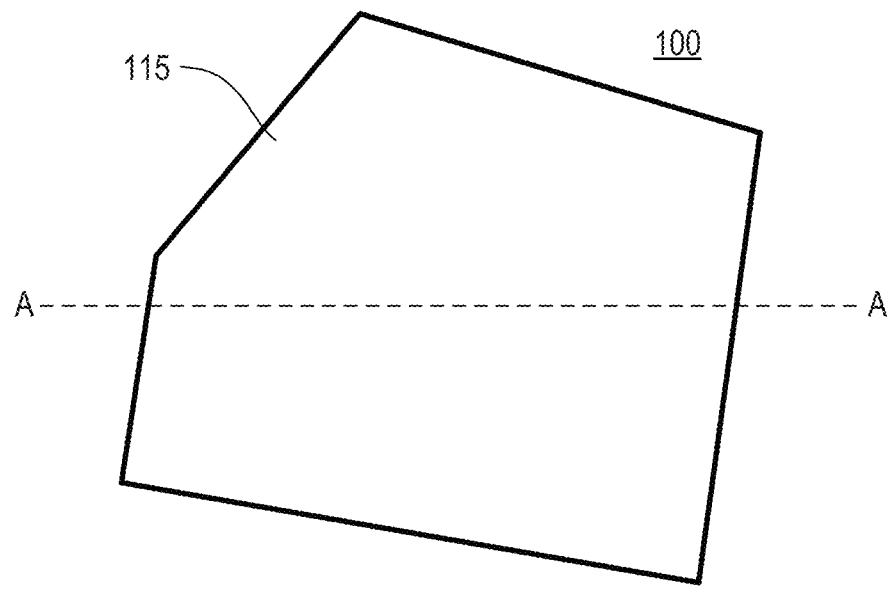
FIG. 1B is a top view of the acoustic resonator shown in FIG. 1A.
Figure 2:
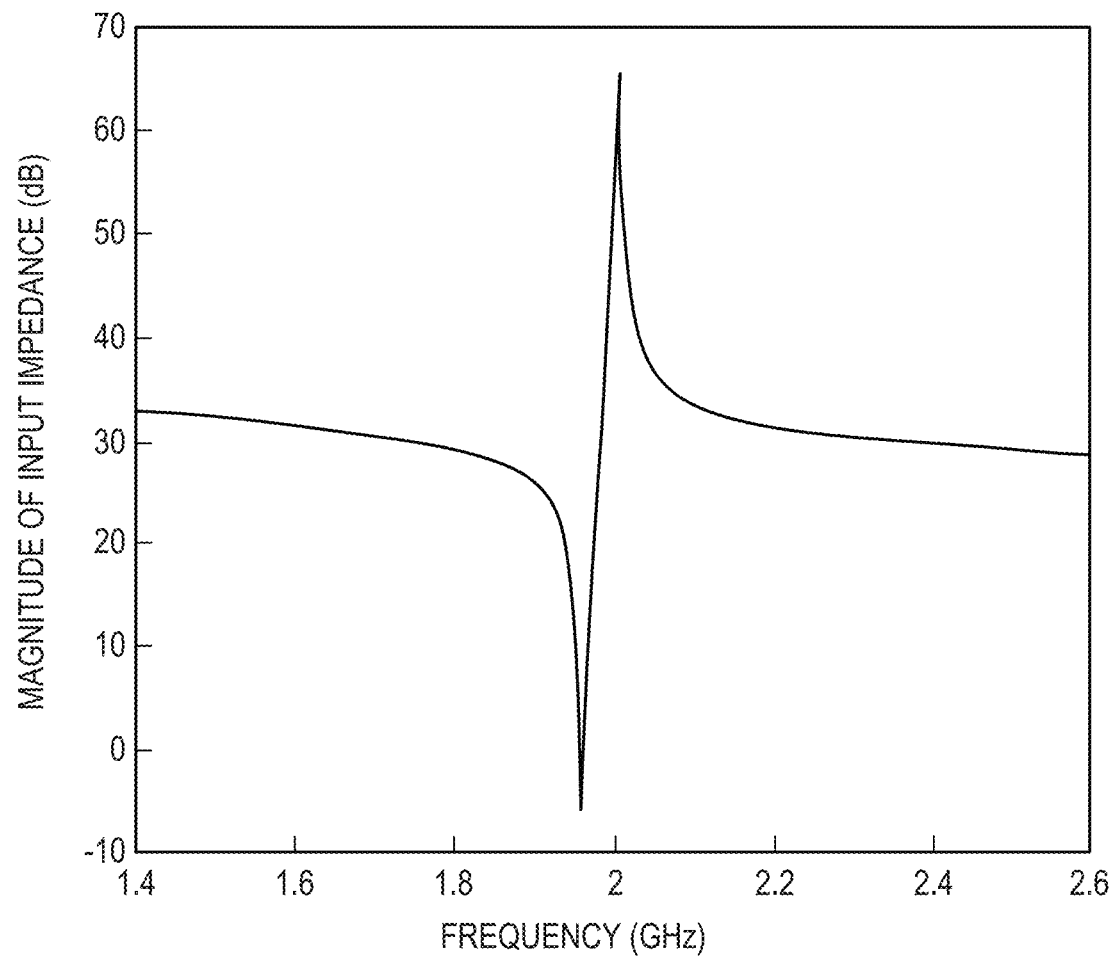
FIG. 2 illustrates an example input impedance response versus frequency for an acoustic resonator.
Figure 3A:
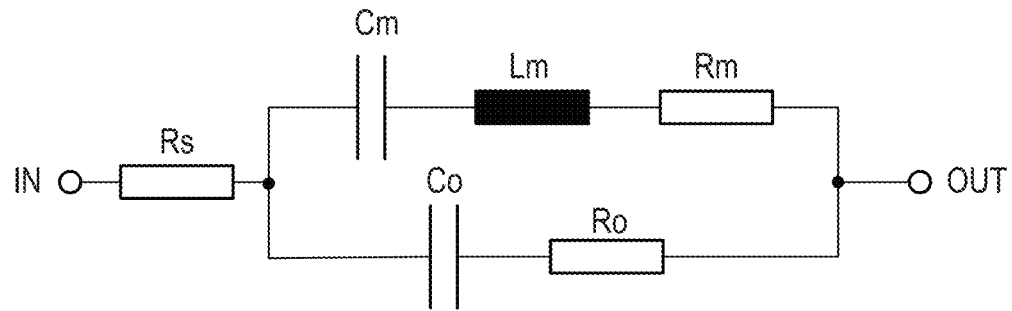
FIG. 3A shows an electrical model of a BAW such as an FBAR.
Figure 3B:
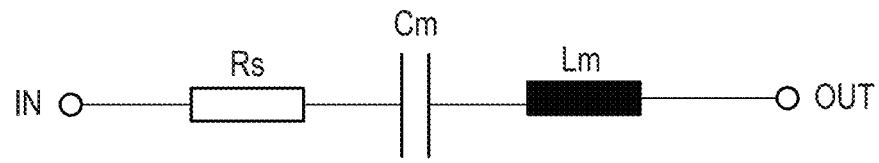
FIG. 3B shows a simplified model of a BAW resonator at series resonance.
Figure 3C:
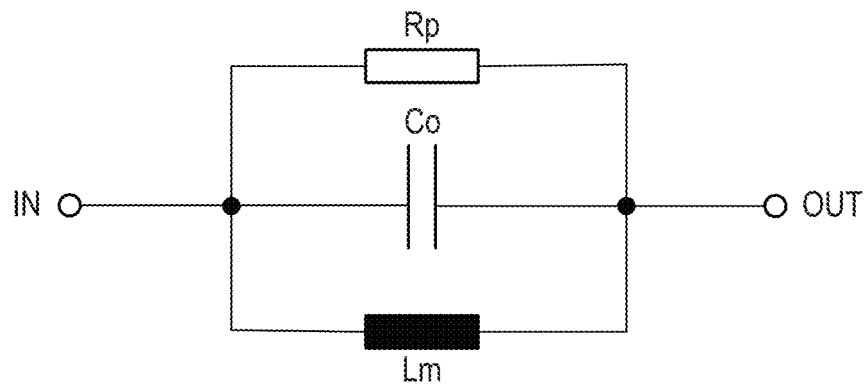
FIG. 3C shows a simplified model of a BAW resonator at parallel resonance.

In the following detailed description, for purposes of explanation and not limitation, example embodiments disclosing specific details are set forth in order to provide a thorough understanding of the present teachings. However, it will be apparent to one having ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical, scientific, or ordinary meanings of the defined terms as commonly understood and accepted in the relevant context.

The terms 'a', 'an' and 'the' include both singular and plural referents, unless the context clearly dictates otherwise. Thus, for example, 'a device' includes one device and plural devices. The terms 'substantial' or 'substantially' mean to within acceptable limits or degree. The term 'approximately' means to within an acceptable limit or amount to one of ordinary skill in the art. Relative terms, such as "above," "below," "top," "bottom," "upper" and "lower" may be used to describe the various elements' relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be below that element. Where a first device is said to be connected or coupled to a second device, this encompasses examples where one or more intermediate devices may be employed to connect the two devices to each other. In contrast, where a first device is said to be directly connected or directly coupled to a second device, this encompasses examples where the two devices are connected together without any intervening devices other than electrical connectors (e.g., wires, bonding materials, etc.).

The disclosed embodiments relate generally to BAW resonators such as FBARs, DBARs, and coupled resonator filters (CRFs). For simplicity of explanation, several embodiments are described in the context of FBAR technologies; however, the described concepts can be adapted for use in other types of BAW resonators. Certain details of FBARs, DBARs, CRFs, materials thereof and their methods of fabrication may be found in one or more of the following commonly owned U.S. Patents, Patent Application Publications and Patent Applications: U.S. Pat. No. 6,107,721, to Lakin; U.S. Pat. Nos. 5,587, 620, 5,873,153 and 6,507,983 to Ruby, et al.; U.S. Pat. No. 7,629,865 to Ruby, et al.; U.S. Pat. No. 7,280,007 to Feng, et al.; U.S. Patent Application Publication No. 2007/0205850 to Jamneala, et al.; U.S. Pat. No. 7,388,454 to Richard C. Ruby, et al; U.S. Patent Application Publication No. 2010/0327697 to Choy, et al.; and U.S. Patent Application Publication No. 2010/0327994 to Choy, et al. Examples of DBARs and CRFs as well as their materials and methods of fabrication, may be found in U.S. Pat. No. 7,889,024 to Paul Bradley et al., U.S. Patent Application Publication No. 20120248941 to, U.S. Patent Application Publication No. 20120218056 to Burak et al., U. S. Patent Application Publication No. 20120218055 to Burak, et al., U.S. patent application Ser. No. 13/101,376 of Burak et al., and filed on May 5, 2011, and U.S. patent application Ser. No. 13/161,946 of Burak, et al., and filed on Jun. 16, 2011. The disclosures of these patents, patent application publications and patent applications are specifically incorporated herein by reference. It is emphasized that the components, materials and method of fabrication described in these patents and patent applications are representative and other methods of fabrication and materials within the purview of one of ordinary skill in the art are contemplated.

In certain embodiments, an acoustic resonator comprises an active region surrounded by a guard ring. The guard ring can be formed adjacent to a top and/or bottom electrode of the acoustic resonator. In addition, the guard ring can be electrically biased with a different voltage than the top and/or bottom electrode. In general, the presence of the guard ring can improve performance of the acoustic resonator by improving confinement of piston mode within the active region and by suppressing the excitation of spurious lateral modes. The electrical biasing of the guard ring can further improve FBAR's performance by shifting the cutoff frequencies in the guard-ring region. These improvements may take the form of increased Rp and/or $Kt^2$, for example. In addition, these improvements can be optimized by adjusting geometric properties of the guard ring, such as its width or its distance from the top and/or bottom electrode.

Figure 4A:
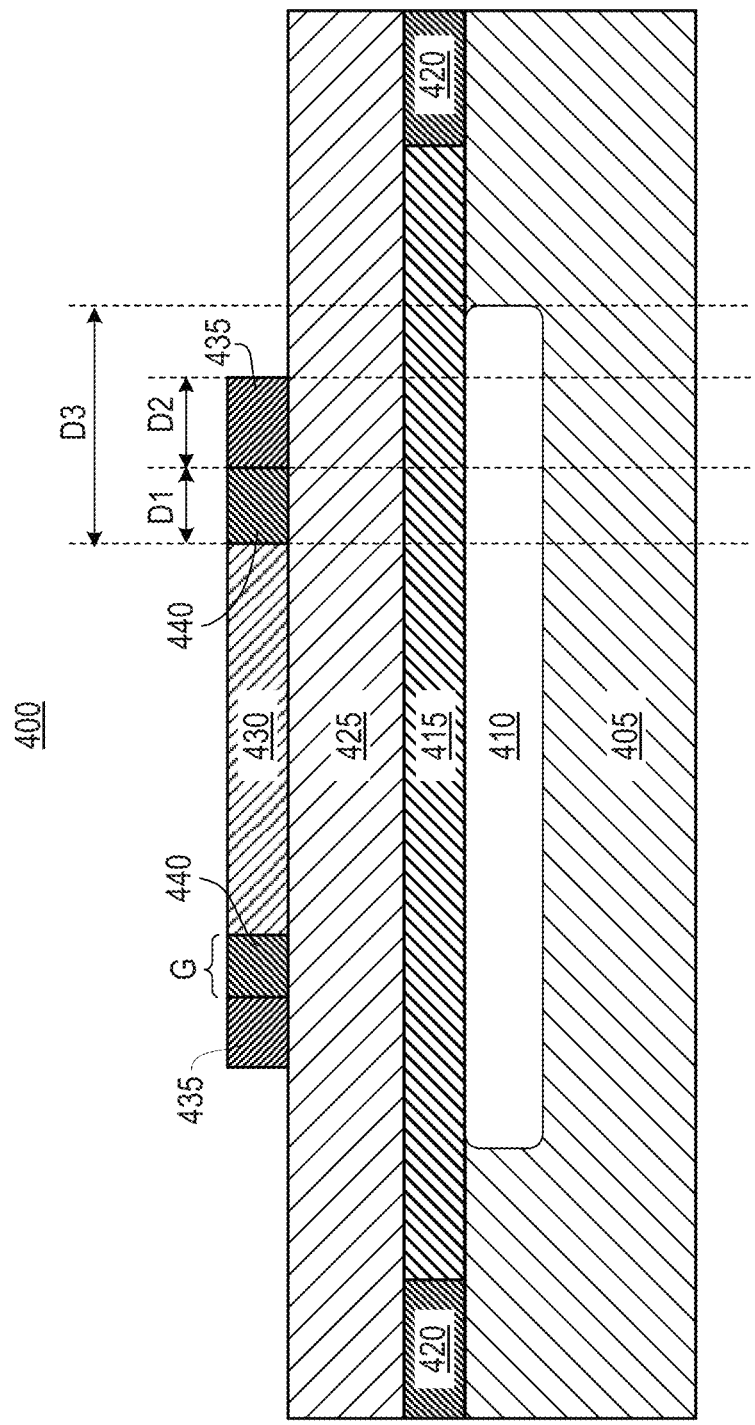
FIG. 4A is a cross-sectional view of an FBAR according to a representative embodiment.
Figure 4B:
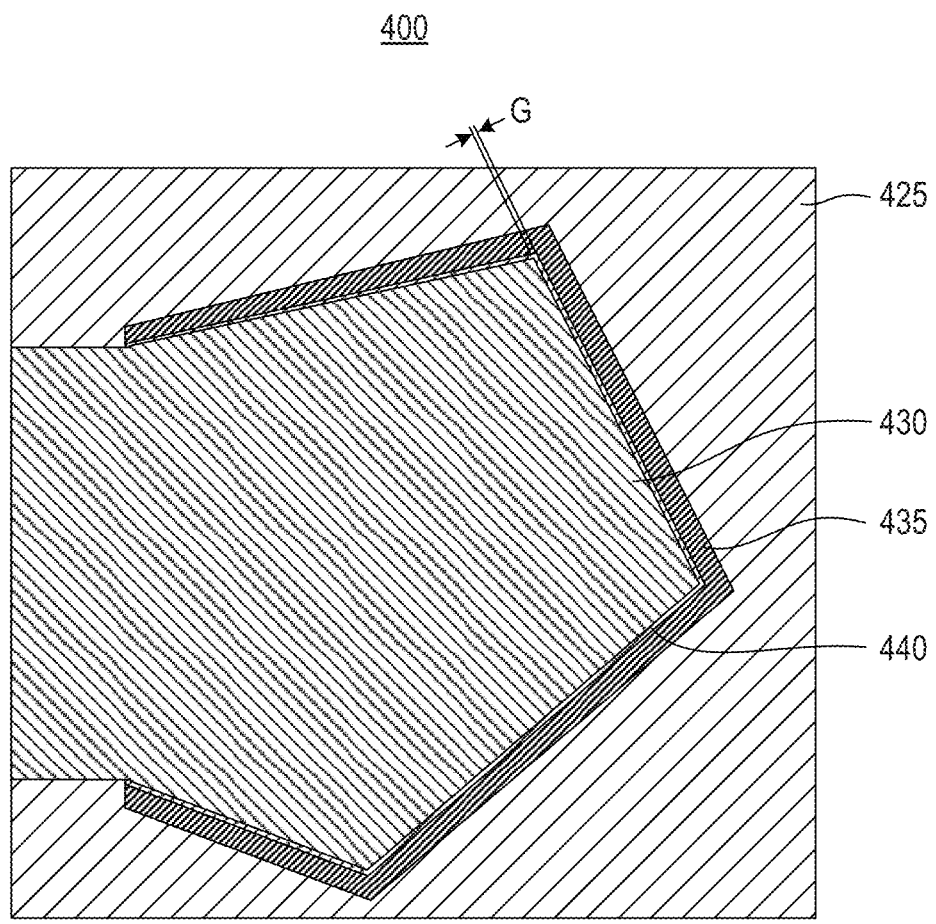
FIG. 4B is a top view of the FBAR of FIG. 4A.

FIG. 4A is a cross-sectional view of an FBAR 400 according to a representative embodiment, and FIG. 4B is a top view of the FBAR of FIG. 4A.

Referring to FIG. 4A, FBAR 400 comprises a substrate 405, a cavity 410, a bottom electrode 415, a bottom planarization layer 420, a piezoelectric layer 425, a top electrode 430, a guard ring 435, and a top planarization layer 440. Top planarization layer 440 is located in a gap "G" between top electrode 430 and guard ring 435; gap G is necessary to prevent electrical shorting between top electrode 430 and guard ring 435.

During typical operation, an input electrical signal is applied to an input terminal of top electrode 430, and bottom electrode 415 is connected to ground. The input electrical signal typically comprises a time-varying voltage that causes vibration in the active region. This vibration in turn produces an output electrical signal at an output terminal of top electrode 430.

Without the guard ring 435 and the top planarization layer 440 the electrically excited piston mode is terminated at the edge of top electrode 430. The top electrode edge presents a significant discontinuity in cutoff frequencies between the main active region defined as an overlap between the bottom electrode 415, the piezoelectric layer 425 and the top electrode 430, and the region outside of the edge of top electrode 430. This discontinuity causes excitation of lateral modes in both membrane and outside regions, leading in turn to undesirable scattering of acoustic energy from the piston mode and the resulting degradation of electrical response of FBAR 400.

The presence of guard ring 435 reduces the scattering of energy from the piston mode by lowering the cutoff frequency in the region of the guard ring 435 towards the cutoff frequency of the active region. However, due to gap G between the active region and the guard ring 435, the net cutoff frequency in the region between the outer edge of the top electrode 430 and the outer edge of guard ring 435 is a weighted average of cutoff frequencies in gap G and guard ring 435 regions, which is typically higher than the cutoff frequency of the active region.

In order to further lower that cutoff frequency towards and below the active region cutoff frequency (series resonance frequency Fs of FBAR 400), top planarization 440 and/or guard ring 435 made of metal with lower acoustic velocity than the top electrode 430 will be used in some embodiments as described below. In addition, guard ring 435 may be electrically biased (e.g., connected to ground) in order to dampen certain unwanted vibrations. In some embodiments, for instance, guard ring 435 is connected to ground by connecting it to bottom electrode 415 through piezoelectric layer 425.

Alternatively, guard ring 435 may be electrically floated. In other embodiments, additional mass-loading of guard ring 435 will be used as further described in reference to FIG. 5 below. Once the net cutoff frequency in gap G and guard ring 435 regions is lowered below the series resonance frequency Fs of FBAR 400, the electrically excited piston mode is terminated at the edge of top electrode 430, but the effective resonant cavity is laterally extended to the outer edge of the guard ring 435. This is turn reduces acoustic energy density at the outer edge of the effective cavity and therefore beneficially increases parallel resistance Rp without degradation of electromechanical coupling coefficient $Kt^2$. In addition, proper selection of widths of gap G and guard ring 435 regions allows for resonant suppression of spurious lateral modes excited by structural and electric field discontinuities at the edge of top electrode 430, and therefore allows for further resonant increase of parallel resistance Rp.

Substrate 405 comprises a material compatible with semiconductor processes, such as silicon (Si), gallium arsenide (GaAs), indium phosphide (InP), glass, sapphire, alumina, or the like. Cavity 410 is formed within substrate 405, and it functions to allow free mechanical vibration of an active region formed by an overlap between bottom electrode 415, top electrode 430, and piezoelectric layer 425. Cavity 410 typically comprises an air gap, but it could alternatively comprise an acoustic mirror such as a Bragg mirror, for instance. Examples of various fabrication techniques of cavities in a substrate are described by U.S. Pat. No. 7,345,410 of Grannen et al., filed on Mar. 18, 2008, and various fabrication techniques of acoustic mirrors are described in U.S. Pat. No. 7,358,831 of Larson III, et al., filed Apr. 15, 2008, which are hereby incorporated by reference.

Bottom electrode 415 is formed on substrate 405 over cavity 410, and bottom planarization layer 420 is formed on substrate 405 adjacent to bottom electrode 415. Piezoelectric layer 425 is formed over bottom electrode 415 and bottom planarization layer 420. Top electrode 430 is formed on piezoelectric layer 425 over a center portion of cavity 410, and guard ring 435 is formed on piezoelectric layer 425 around top electrode 430. Finally, top planarization layer 440 formed between top electrode 430 and guard ring 435.

Bottom and top electrodes 415 and 430, as well as guard ring 435, are typically formed of an electrically conductive metal such as molybdenum (Mo), tungsten (W), or copper (Cu). In general, these features can be formed of the same material or of different materials according to different design specifications or tradeoffs. For example, in some embodiments, bottom and top electrodes 415 and 430 may be formed of a material having relatively high acoustic velocity (e.g., Mo), while guard ring 435 is formed of a material having relatively low acoustic velocity (e.g., W). The use of these different materials can enhance confinement of electrically excited to piston mode the active region of FBAR 400. In addition, bottom and top electrodes 415 and 430, as well as guard ring 435, may be formed with the same or different thicknesses. For example, guard ring 435 may be formed with a greater thickness than bottom and top electrodes 415 and 430 such that it further lowers the cutoff frequency beyond the top electrode 430 edge as mentioned above.

Piezoelectric layer 425 typically comprises a thin film of piezoelectric material such as zinc oxide (ZnO), aluminum nitride (AlN) or lead zirconium titanate (PZT), although it may comprise other materials.

Bottom and top planarization layers 420 and 440 are typically formed of a planarization material such as non-etchable borosilicate glass (NEBSG). These layers are not required for the functioning of FBAR 400, but their presence can confer various benefits. For instance, the presence of bottom planarization layer 420 tends to improve the structural stability of FBAR 400, it can improve the quality of growth of subsequent layers, and it may allow bottom electrode 415 to be formed without its edges extending beyond cavity 410. Further examples of potential benefits of planarization are presented in U.S. patent application Ser. No. 13/286,038 filed Oct. 31, 2011, the subject matter of which is hereby incorporated by reference.

In general, the presence of a planarization layer between an electrode and a guard ring can further lower the cutoff frequency beyond the top electrode 430 edge, and can therefore result in improved performance of FBAR 400 as mentioned above. In some embodiments, the planarization layer can be formed of a composite structure designed to further improve an alignment of cutoff frequencies. Such a composite structure may be formed by a first layer having a first acoustic velocity and impedance, and a second layer formed on the first layer and having a second acoustic velocity and impedance, with generally second acoustic velocity and impedance being lower than the first acoustic velocity and impedance. In such composite planarization structure the first planarization layer facilities better acoustic energy confinement in the piezoelectric layer 425, while the second planarization layer facilities chemical mechanical planarization process to create a planarized region being flush with top electrode 430 and guard ring 435. Better confinement of acoustic energy in piezoelectric layer 425 in top planarization layer 440 may provide enhanced FBAR 400 performance with increased parallel resistance Rp.

Referring to FIG. 4B, FBAR 400 has the shape of an apodized pentagon. In other words, it is formed with five edges of different lengths. In alternative embodiments, FBAR 400 can be formed with fewer or additional edges, e.g., six or seven edges. One edge of FBAR 400 is typically used to connect bottom and top electrodes 415 and 430 to input/output terminals, and to connect guard ring 435 to a bias voltage. This edge is referred to as a connecting edge, while other edges are referred to as non-connecting edges. In the connecting edge, bottom and top electrodes 415 and 430 may extend farther to one side compared to non-connecting edges. For instance, these electrodes could extend to the left in FIG. 4B to connect with input/output terminals. Due to the presence of the connecting edge, guard ring may form an incomplete circumference around the active region of FBAR 400 as shown in FIG. 4B. Nevertheless, guard ring 435 typically substantially surrounds the active region by extending around most of the circumference.

The performance of FBAR 400 may vary according to the dimensions, geometry, and relative locations of features shown in FIGS. 4A and 4B. For instance, FIG. 4A shows three distances D1 through D3 that can be adjusted to optimize $Kt^2$ and/or Rp of FBAR 400. Distance D1 represents the amount of space between an outer edge of top electrode 430 and an inner edge of guard ring 435, and distance D2 represents the width of guard ring 435. Distance D3 represents the amount of space between an outer edge of cavity 410 and an outer edge of top electrode 430. A negative value of distance D3 indicates that the outer edge of top electrode 430 is located inside a perimeter of cavity 410, and a positive value of distance D3 indicates that the outer edge of top electrode 430 is located outside the perimeter of cavity 410. Generally, the edge of top electrode 430 is located inside the perimeter of cavity 410 (distance D3 is negative) in order to prevent leakage of acoustic energy to substrate 405.

Figure 4C:
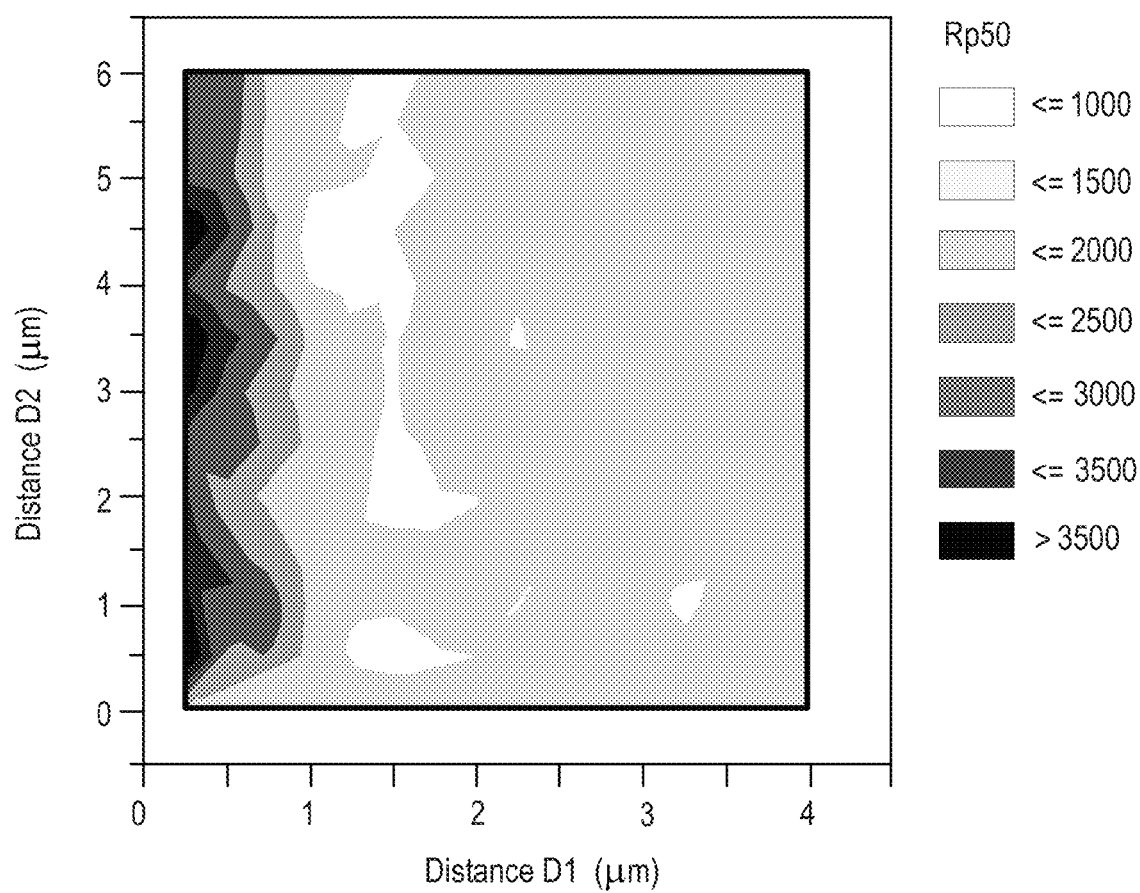
FIG. 4C is a contour plot illustrating the parallel resistance of the FBAR of FIG. 4A as a function of the width and location of a guard ring structure.

FIG. 4C illustrates how changes in distances D1 and D2 may affect the performance of FBAR 400. More specifically, FIG. 4C is a contour plot illustrating the simulated Rp of FBAR 400 as a function of the relative location (distance D1) and width (distance D2) of guard ring 435. In this example, guard ring 435 is electrically floating and is made of W, while the top and bottom electrodes 430 and 415 of FBAR 400 are made of Mo. NEBSG has been assumed as the material of top planarization layer 440. The distances D1 and D2 are illustrated on the x-axis and the y-axis, respectively. As illustrated in FIG. 4C, FBAR 400 exhibits local maximum values of Rp in regions of the contour plot where distance D1 is approximately 0.25 μm and distance D2 is approximately 0.5 μm, 3.5 μm, and 4.5 μm. Distance D1 equal to 0.25 μm was the smallest distance considered in the simulations and this value was determined by typical process capability of forming gap G between top electrode 430 and the guard ring 435. While considering smaller distances is feasible, at some point the fringing electric field between top and bottom electrodes 430 and 415 would provide unwanted biasing of guard-ring 435 and therefore detrimental extension of piston mode excitation all the way to the outer edge of guard ring 435. Thus the widths of gap G and guard ring 435 may be adjusted experimentally to improve performance.

Figure 4D:
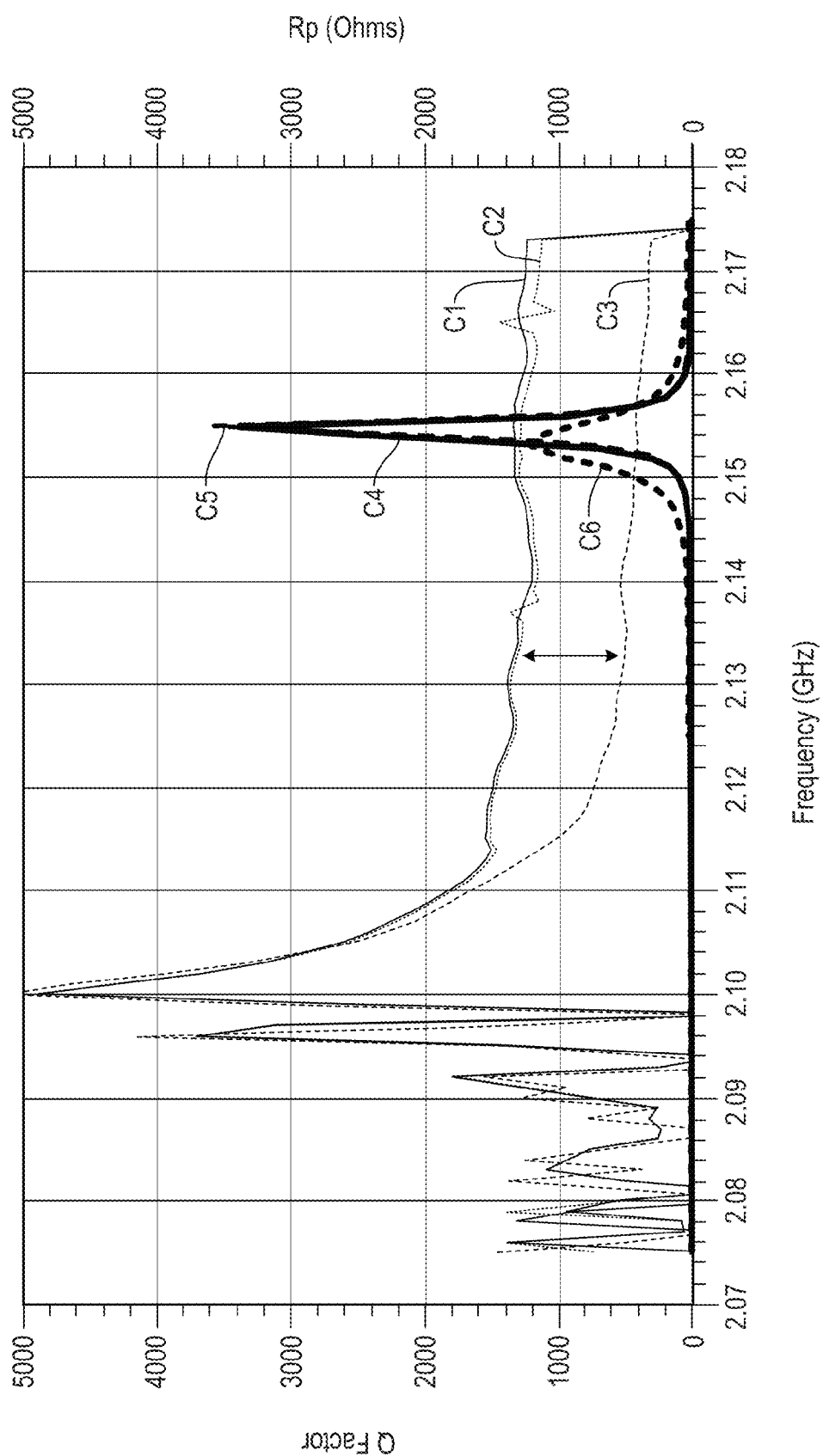
FIG. 4D is a graph illustrating the quality factor (Q-factor) and parallel resistance of the FBAR of FIG. 4A.

FIG. 4D is a graph illustrating the quality factor (Q-factor) and parallel resistance Rp of FBAR 400. For comparison purposes, these parameters are shown for three different variations of FBAR 400. In a first variation, guard ring 435 is connected to ground ("grounded GR device"). In a second variation, guard ring 435 is electrically floated ("floating GR device"). In a third variation, guard ring 435 is omitted from FBAR 400 ("reference device"). In the grounded GR device and the floating GR device, the distance D1 is 0.25 μm and the distance D2 is 1 μm, and the distance D3 is −5 μm. Notably, this geometry corresponds to highest value of Rp shown in FIG. 4C.

Referring to FIG. 4B, Q-factor is represented by a y-axis on the left side, and Rp is represented by a y-axis on the right side. The values of the Q-factor and Rp are shown as a function of the input signal frequency of FBAR 400.

First through third curves C1-C3 represent the Q-factors for the grounded GR device, the floating GR device, and the reference device, respectively. Similarly, fourth through sixth curves C4-C6 represent Rp values for the grounded GR device, the floating GR device, and the reference device, respectively.

A peak value of the Q-factor occurs for each of the three devices at about 2.1 GHz. This frequency corresponds to the series resonance frequency Fs of the respective devices. Similarly, a peak value of Rp occurs for each of the three devices at about 2.155 GHz. This frequency corresponds to the parallel resonance frequency Fp of the respective devices. The bandwidth of these devices corresponds to the range of frequencies between their respective values of Fs and Fp. Accordingly, in this example, the three devices have similar bandwidths, with the bandwidths of floated and grounded GR devices being marginally larger.

As illustrated by a double headed arrow, at frequencies above Fs, the Q-values for variations of FBAR 400 including guard ring 435 are significantly higher than the Q-value of FBAR 400 without guard ring 435. In addition, as illustrated by the respective peaks of fourth through sixth curves C4-C6, the respective Rp values for variations of FBAR 400 including guard ring 435 are significantly higher than the Rp value of FBAR 400 without guard ring 435. As illustrated by differences between first and second curves C1 and C2, the grounded GR device has a slightly higher Q-value than the floating GR device at certain frequencies. On the other hand, as illustrated by differences between fourth and fifth curves C4 and C5, the floating GR device has a slightly higher Rp than the grounded GR device at parallel resonance frequency Fp. Accordingly, the application of a bias voltage to guard ring 435 may result in a general performance tradeoff between Q-value and Rp. As mentioned above, generally features that improve Rp usually also degrade $Kt^2$, as it is a case for frames (regions with added thin metal or dielectric layer deposited along the perimeter of FBAR 400), for instance. As the results in FIG. 4D indicate, guard ring 435 yields significant Rp improvement (approximately 3 times) without any noticeable $Kt^2$ degradation.

Figure 5A:
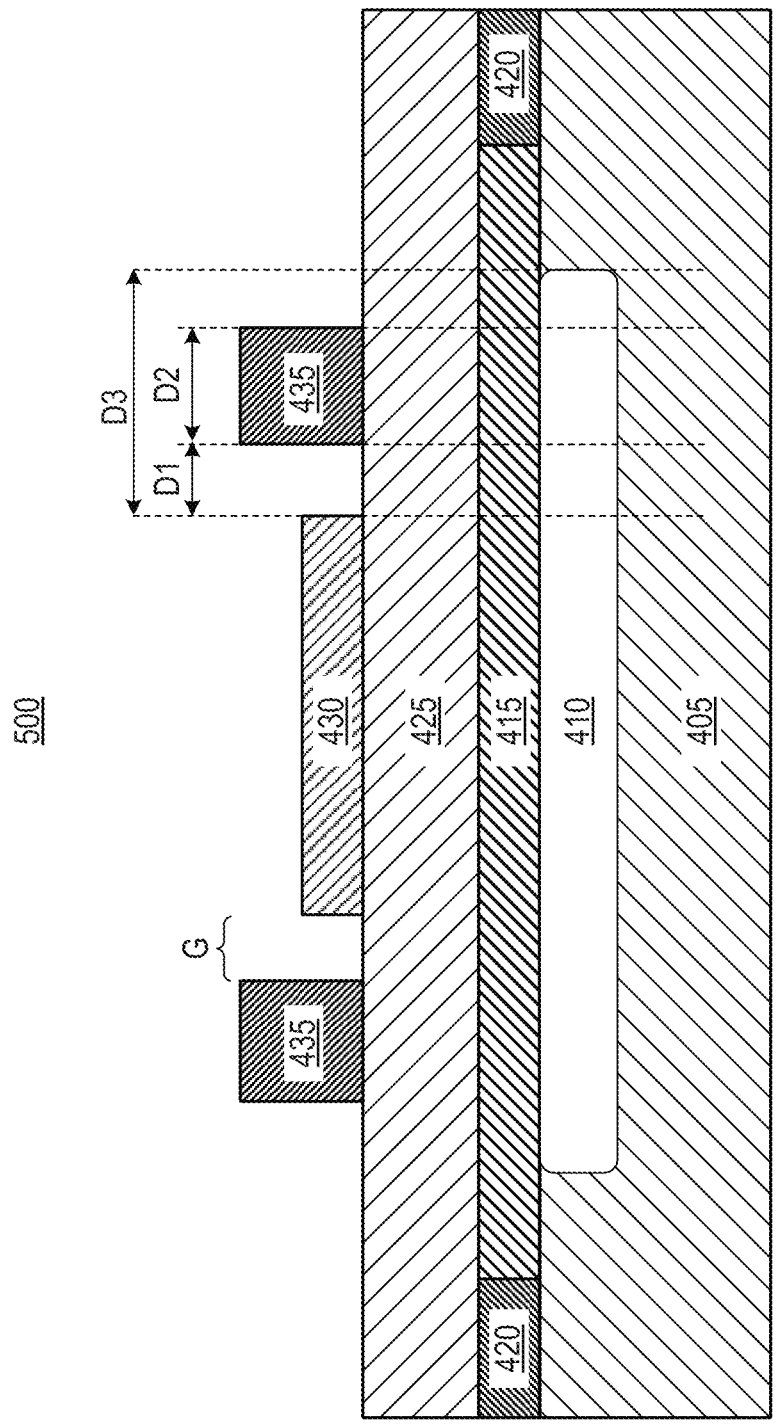
FIG. 5A is a cross-sectional view of an FBAR according to another representative embodiment.

FIG. 5A is a cross-sectional view of an FBAR 500 according to another representative embodiment.

Referring to FIG. 5A, FBAR 500 is similar to FBAR 400, except that guard ring 435 is formed thicker than top electrode 430. The addition of material to create this increased thickness is referred to as "mass loading". Accordingly, where guard ring 435 has the same thickness as top electrode 430, it is considered to have zero mass loading, and where it has a greater thickness, it is considered to have mass loading equal to the difference in thickness. In general, adding mass loading to the guard ring 435 would require either separate deposition and patterning of top electrode 430 and guard ring 435, or separate deposition and patterning of a mass loading to guard ring 435 formed previously in the same process step as top electrode 430.

As mentioned in reference to FIG. 4A, the mass loading of guard ring 435 allows to further lowering of the cutoff frequency of the combined gap G and guard ring 435 region, which in turn can improve device performance by better piston mode confinement to the active region. A notable difference between FBAR 400 and FBAR 500 is that while in FBAR 400 guard ring 435 was made of metal having lower acoustic velocity than the metal used for top electrode 430, in FBAR 500 the same metal material may be used both for top electrode 430 and the mass-loaded guard ring 435. This may provide FBAR 500 with an additional design degree of freedom, especially if material with lower acoustic velocity (for instance W) is already used for either bottom electrode 415, or top electrode 430, or both, to satisfy other FBAR performance requirements. Also, top planarization 440 may or may not be used in FBAR 500.

Figure 5B:
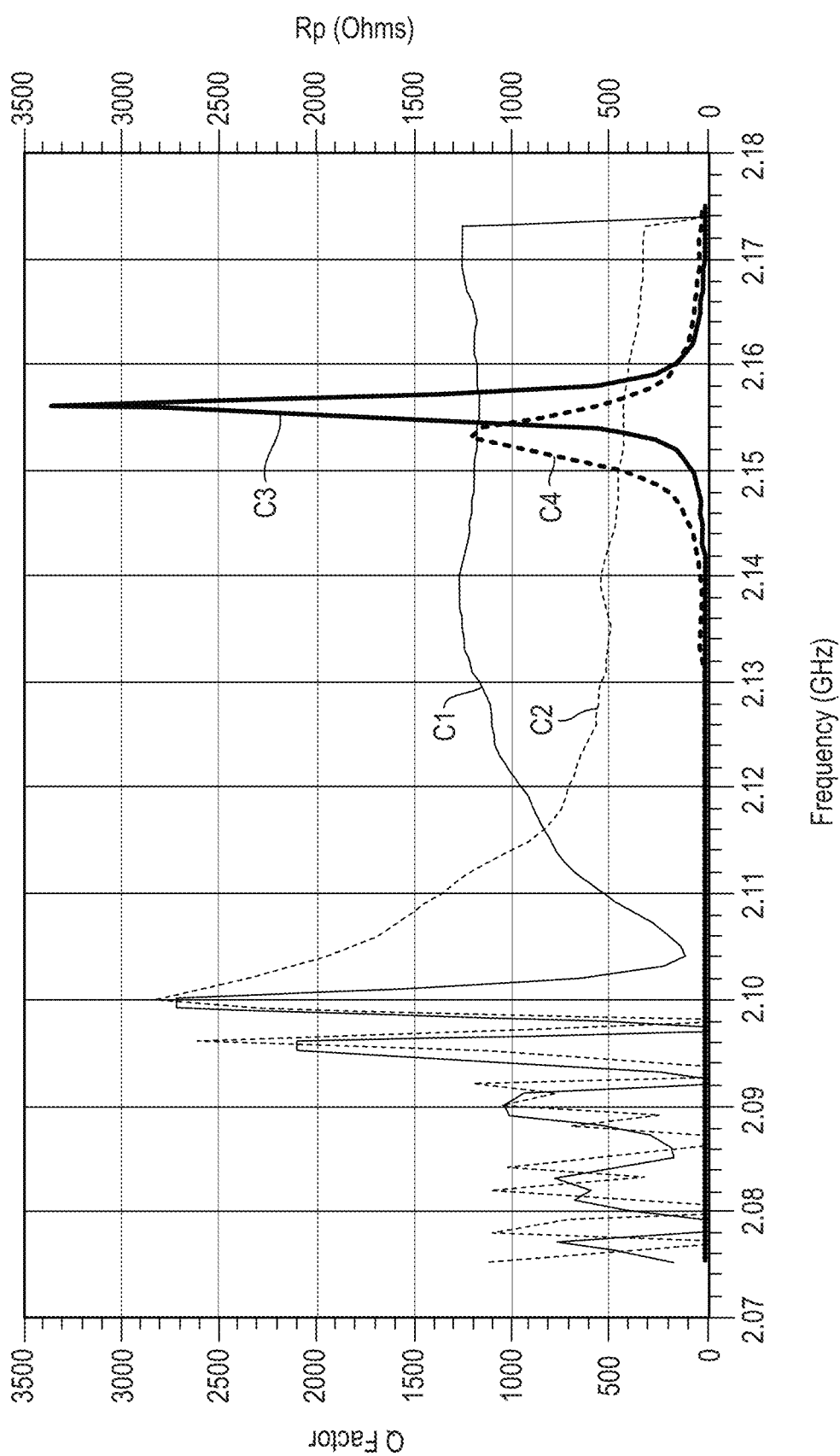
FIG. 5B is a graph illustrating a comparison of the Q-factor and parallel resistance of the FBAR of FIG. 5A without mass loading of a guard ring structure.
Figure 5C:
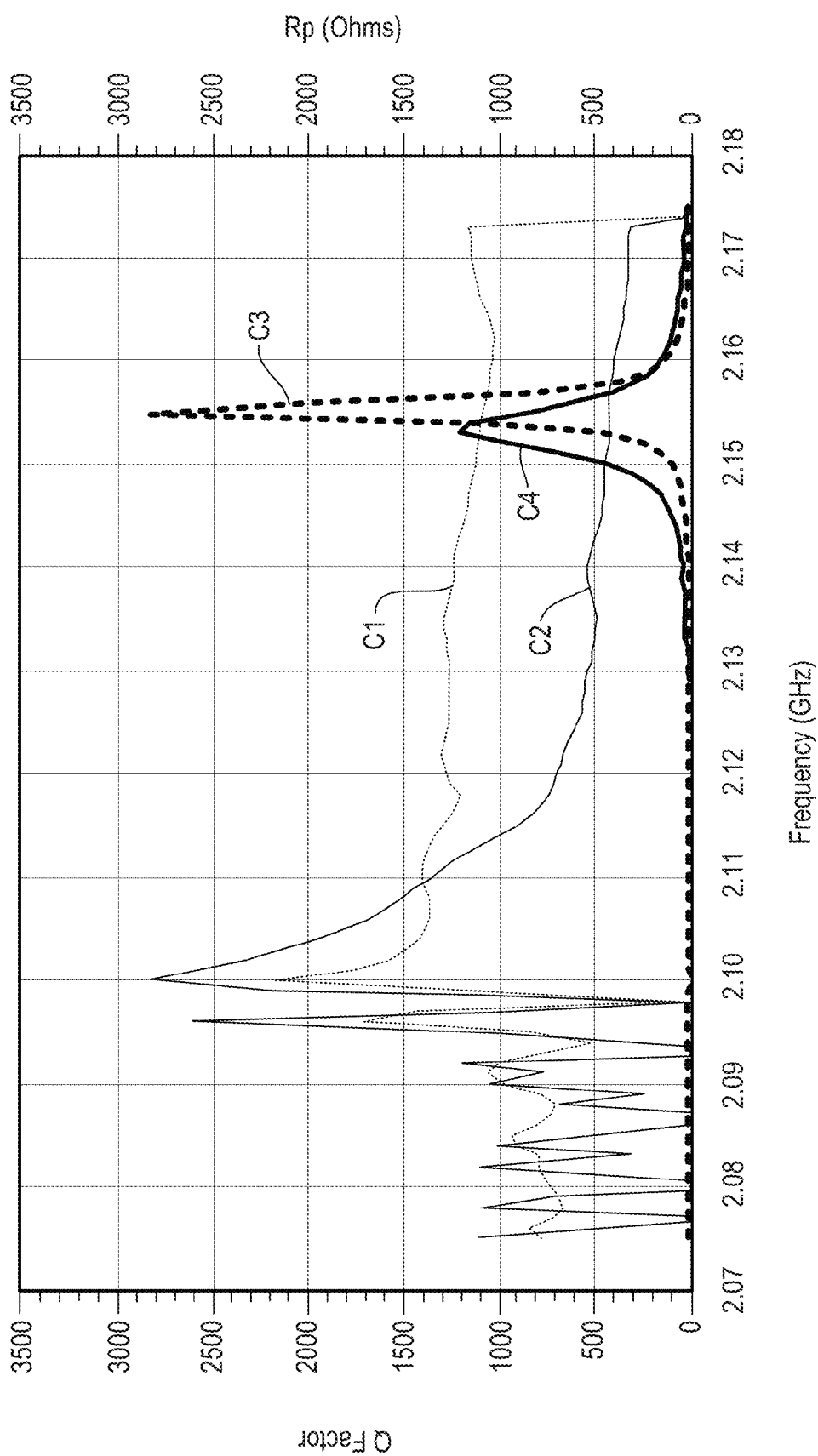
FIG. 5C is a graph illustrating a comparison of the Q-factor and parallel resistance of the FBAR of FIG. 5A with mass loading of a guard ring structure.

FIGS. 5B and 5C are graphs illustrating a comparison of the Q-factor and Rp of FBAR 500 with and without mass loading of a guard ring structure. In particular, FIG. 5B shows the values of these parameters without mass loading and FIG. 5C shows the values of these parameters with mass loading. In each of FIGS. 5B and 5C, the Q-value and Rp are illustrated for variations of FBAR 500 where guard ring 435 is connected to ground ("grounded GR device"), and where guard ring 435 is omitted ("reference device").

In the grounded GR devices of FIGS. 5B and 5C, the distance D1 is 0.25 μm, the distance D2 is 3 μm, and the distance D3 is −5 μm. In addition, top electrode 430 and guard ring 435 are both formed of molybdenum. In the grounded GR device of FIG. 5B, guard ring 435 has zero mass loading, and in the grounded GR device of FIG. 5C, guard ring has mass loading of 200 A.

Referring to FIGS. 5B and 5C, first and second curves C1 and C2 correspond to the respective Q-values of the grounded GR device and the reference device, and third and fourth curves C3 and C4 correspond to the respective Rp values of the grounded GR device and the reference device.

As illustrated by first and second curves C1 and C2, at frequencies above ~2.116 GHz, the grounded GR device exhibits better Q-value than the reference device in both FIGS. 5B and 5C. However, in the absence of mass loading, as illustrated by curve C1 in FIG. 5B, the grounded GR device exhibits a lower Q-value than the reference device in a frequency range of about 2.10 GHz to 2.116 GHz. As described in relation to FIG. 4A, in the grounded GR device without mass loading, the effective cutoff frequency of gap G and guard ring 435 regions occurs at approximately 2.104 GHz, which is approximately 4 MHz above the series resonance frequency Fs of the active FBAR 500. This additional cutoff frequency is responsible for significantly lower Q-factor in the frequency range of about 2.10 GHz to 2.116 GHz, as evidenced by curve C1 in FIG. 5B. Providing 200 Å of mass load to guard ring 435 allows to down-shift this cutoff frequency below the series resonance frequency Fs of the active FBAR 500 which results in smooth Q-factor above Fs of FBAR 500, as evidenced by curve C1 in FIG. 5C. In addition, some of the undesirable rattles in the Q-spectrum below Fs get suppressed, as also evidenced by comparison of curves C1 and C2 in FIG. 5C. Accordingly, the use of mass loading of guard ring 435 may provide a significant improvement in the whole spectrum of Q-values of FBAR 500.

As illustrated by the third and fourth curves C3 and C4, the grounded GR device has a higher Rp value with or without mass loading. However, as illustrated by a comparison of the peak value of curve C3 as shown in FIG. 5B and FIG. 5C, the grounded GR device has a higher Rp value without mass loading than it does with mass loading.

As illustrated by first through fourth curves C1 through C4, the use of mass loading may increase Q-values in parts if the pass-band of FBAR 500 but it may also decrease Rp at parallel resonance frequency Fp. In other words, the use of mass loading produces a tradeoff between Q-values in different parts of the pass-band frequencies of FBAR 500 and Rp at Fp. In general, however, a smoothed out Q-spectrum in the whole range of pass-band frequencies provided by FBAR 500 with mass loaded guard ring 435 shown in FIG. 5C is preferable as compared to FBAR 500 with non mass loaded guard ring 435.

Figure 6A:
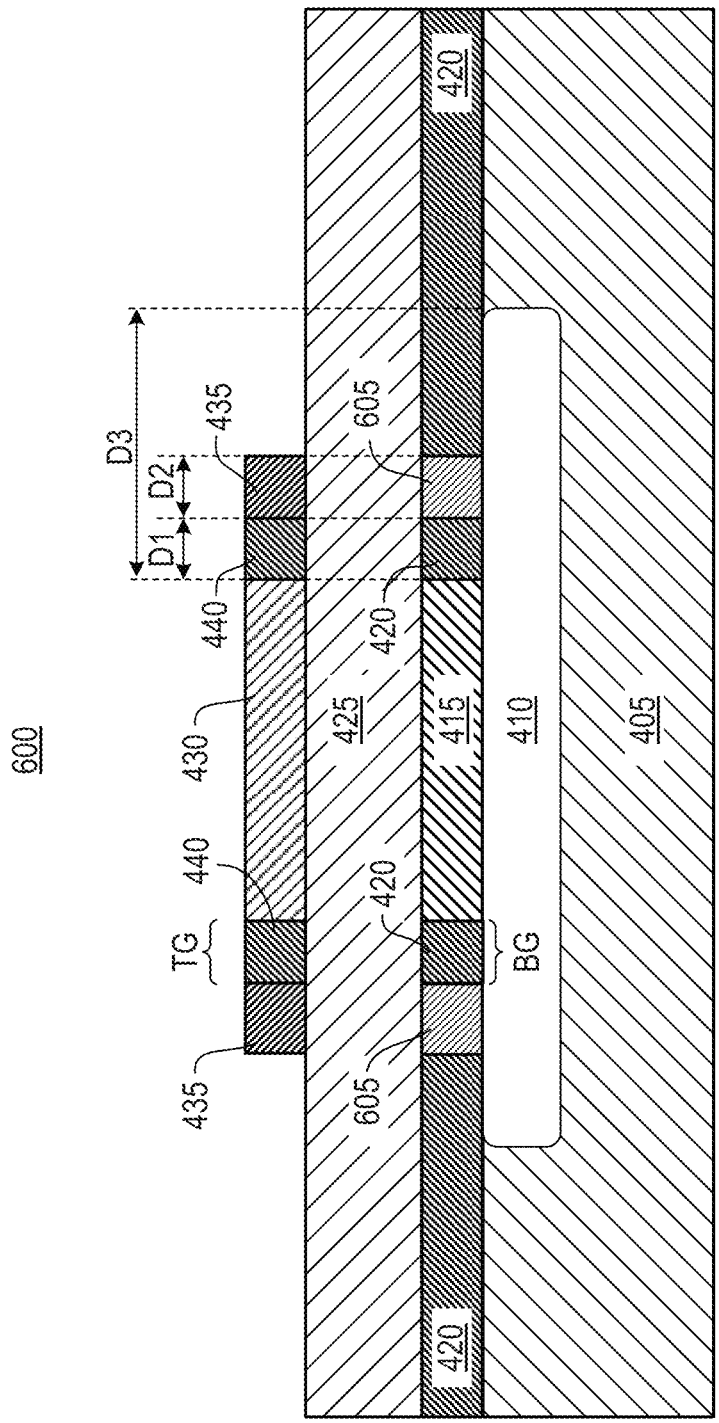
FIG. 6A is a cross-sectional view of an FBAR according to another representative embodiment.

FIG. 6A is a cross-sectional view of an FBAR 600 according to another representative embodiment.

Referring to FIG. 6A, FBAR 600 is similar to FBAR 400, except that an additional guard ring 605 is formed adjacent to bottom electrode 415. Bottom and top electrodes 415 and 430 are aligned at their respective edges, and guard rings 435 and 605 are also aligned at their respective edges. Thus bottom gap BG and top gap TG have the same widths. Bottom planarization layer 420 is provided to facilitate smooth growth of piezoelectric layer 425. Bottom and top planarization layers 420 and 440 also facilitate additional mass-loading of the bottom and top gaps BG and TG region between bottom electrode 415 and bottom guard ring 605, and the top electrode 430 and the top guard ring 435. Nevertheless, one or both of bottom and top planarization layers 420 and 440 may be omitted in some embodiments without limiting the scope of the present teachings. In other embodiments, one or both bottom and/or top planarization layers 420 and 440 may be formed of composite materials, as described in relation to FIG. 4A also without limiting the scope of the present teachings.

As in the embodiment of FIG. 4A, an improvement in Q-factor in the present configuration relies on shifting the effective cutoff frequency in the region between the outer edges of bottom and top electrodes 415 and 430 and the outer edges of bottom and top guard rings 605 and 435 below the series resonance frequency Fs of FBAR 600 (cutoff frequency of a region where bottom electrode 415, piezoelectric layer 425 and top electrode 430 overlap). Such alignment of cutoff frequencies allows for reduction of acoustic energy losses due to piston mode scattering at the outer edges of top and bottom electrodes 430 and 415, as described above.

Guard rings 435 and 605 may be formed of the same or a different material compared to bottom and top electrodes 415 and 430. For instance, all of these features may be formed of molybdenum to simplify the manufacture of FBAR 600, or one or both of the guard rings may be formed of tungsten while the other features are formed of molybdenum.

During operation of FBAR 600, guard rings 435 and 605 may be floated or they may be electrically biased. In certain embodiments, guard ring 435 is electrically biased by connecting it to bottom electrode 415, while guard ring 605 is electrically biased by connecting it to top electrode 430. These connections can be made, for instance, by creating electrical vias through piezoelectric layer 425 in a peripheral region of FBAR 600. The biasing of guard rings 435 and 605 in this manner creates an electrical field in the guard rings that is opposite an electrical field in the active region of FBAR 600. For example, if the electrical field in the active region points up, the electrical field in guard rings 435 and 605 will point down because they have opposite biases relative to top and bottom electrodes 430 and 415.

A potential benefit of this opposite biasing effect is that it may enhance suppression of spurious lateral modes generated at the edges of bottom and top electrodes 415 and 430. These spurious lateral modes typically propagate from the edges of the bottom and top electrodes toward the guard rings and are then reflected by the guard ring. However, these modes may also produce some motion in the guard rings. The opposite biasing of the guard rings tends to produce motion in an opposite direction relative to that produced by the spurious lateral modes, and therefore it tends to cancel or otherwise suppress the spurious lateral modes. Moreover, this suppressing effect can be enhanced by fine tuning the width of the guard rings and their distance from the corresponding bottom and top electrodes.

Figure 6B:
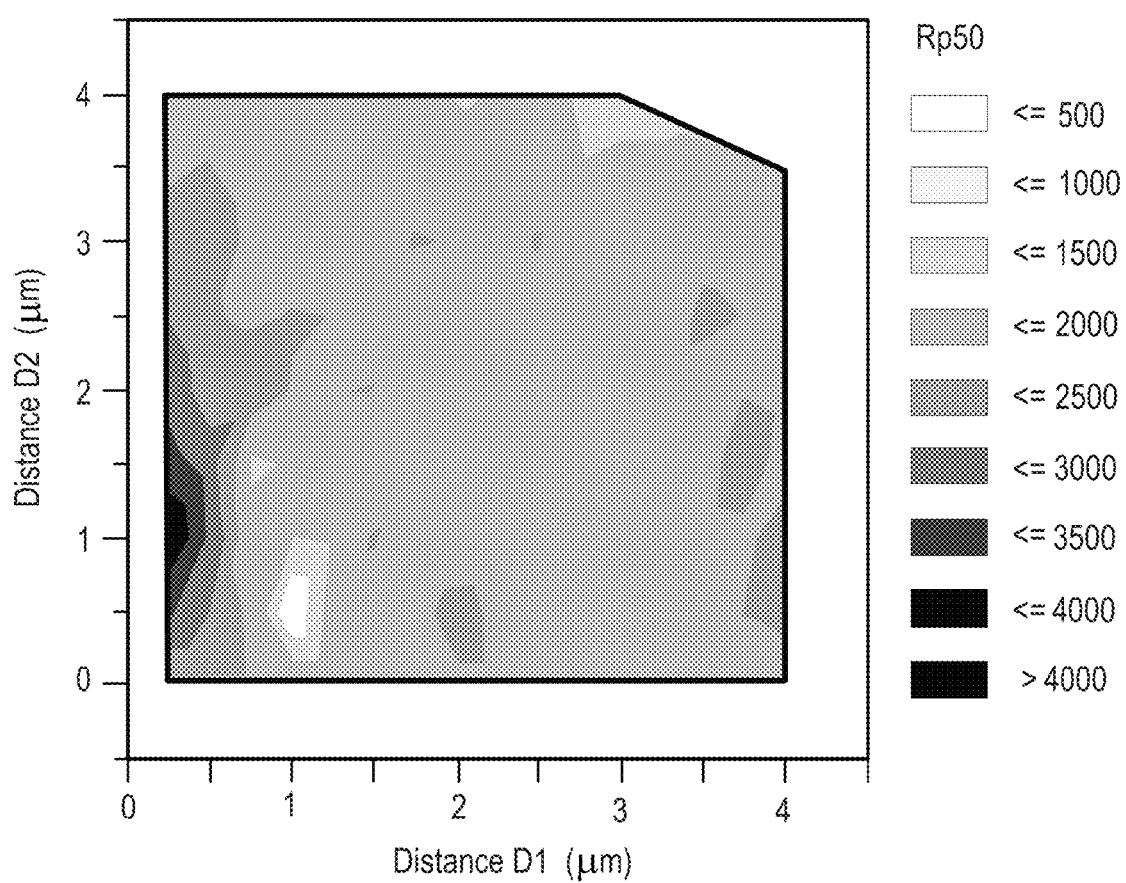
FIG. 6B is a contour plot illustrating the parallel resistance of the FBAR of FIG. 6A as a function of the width and location of a guard ring structure.

FIG. 6B is a contour plot illustrating the simulated parallel resistance of FBAR 600 of FIG. 6A as a function of the location and width of guard rings 435 and 605. In this embodiment, guard rings 435 and 605 are formed of tungsten and they are electrically floated. In addition, bottom and top planarization layers 420 and 440 of bottom and top gaps BG and TG are formed as shown in FIG. 6A, and they are formed of NEBSG. The bottom and top electrodes 415 and 430 are formed of molybdenum. The distance D3 between the edge of the top electrode 430 and cavity 410 outer perimeter is −5 μm.

Referring to FIG. 6B, the distance between the guard rings and the corresponding electrodes is represented as distance D1 on the x-axis of the contour plot, and the width of the guard rings is represented as distance D2 on the y-axis of the contour plot. FBAR 600 exhibits a local maximum value of Rp where distance D1 is approximately 0.25 μm and distance D2 is approximately 1.0 μm. Notably, distance D1 equal to 0.25 μm was the smallest distance considered in the simulations and this value was determined by typical process capability of forming top and bottom gaps TG and BG between the top electrode 430 and the top guard ring 435, and the bottom electrode 415 and the bottom guard ring 605. While considering smaller distances would be feasible, at some point the fringing electric fields formed between top and bottom electrodes 430 and 415 would provide unwanted biasing of top and bottom guard-rings 435 and 605, and therefore detrimental extension of piston mode excitation all the way to the outer edge of top and bottom guard rings 435 and 605. Thus the widths of top and bottom gaps TG and GB, and top and bottom guard rings 435 and 605 may be optimized experimentally for the best performance.

Figure 6C:
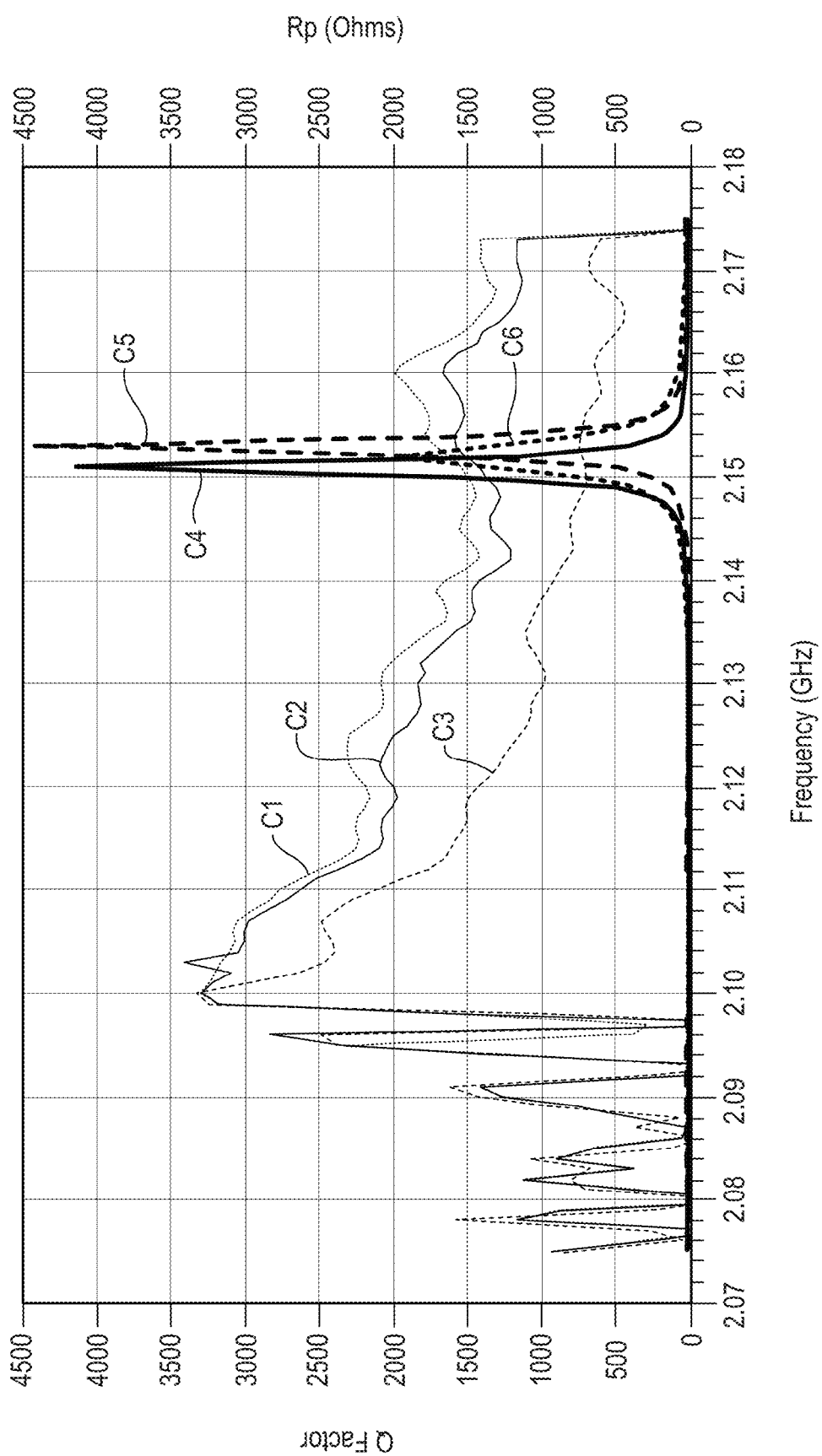
FIG. 6C is a graph illustrating the Q-factor and parallel resistance of the FBAR of FIG. 6A.

FIG. 6C is a graph illustrating the simulated Q-factor and parallel resistance of FBAR 600 shown in FIG. 6A. In FIG. 6C, the Q-factor is represented by a y-axis on the left side, and Rp is represented by a y-axis on the right side. The values of the Q-factor and Rp are shown as a function of the input signal frequency of FBAR 600.

Referring to FIG. 6C, curves C1 and C4 represent a first variation of FBAR 600 in which guard ring 435 is connected to ground and guard ring 605 is connected to top electrode 430 ("reverse biased GR device"). Curves C2 and C5 represent a second variation in which guard rings 435 and 605 are electrically floated ("floating GR device"). Curves C3 and C6 represent a third variation in which guard ring 435 is omitted from FBAR 600 ("reference device"). In the reverse biased GR device and the floating GR device, the distance D1 is 0.25 μm and the distance D2 is 1 μm, and the distance D3 is −5 μm. Notably, this geometry corresponds to highest value of Rp shown in FIG. 6B.

A peak value of the Q-factor occurs for each of the devices at about 2.1 GHz. These frequencies correspond to the respective series resonance frequencies Fs of the devices. A peak value of Rp occurs for each of the three devices at around 2.15 GHz. This frequency corresponds to the parallel resonance frequency Fp of the respective devices. At frequencies above Fs, the Q-value of the reverse biased GR device tends to be the highest, followed by the floating GR device, followed by the reference device. On the other hand, the Rp of the floating GR device is the highest, followed by the reverse biased GR device and then the reference device.

The bandwidth of FBAR 600 corresponds to the range of frequencies between its respective values of Fs and Fp. Accordingly, in the graph of FIG. 6C, the floating GR device exhibits slightly larger bandwidth than the reverse biased GR device. In general, the bandwidth of an acoustic resonator is a function of the overlap of its electric field and mechanical motion. In the reverse GR device, some of the mechanical motion is suppressed due to the electrical biasing, so the overlap between the electrical field and mechanical motion may be somewhat reduced, contributing to the somewhat smaller bandwidth of the reverse biased GR device.

FIG. 7A is a cross-sectional view of an FBAR 700 according to another representative embodiment.

Referring to FIG. 7A, FBAR 700 is similar to FBAR 600, except that the respective widths of bottom and top electrodes 430 and 415 are adjusted such that the electrodes are not aligned edge-to-edge, and the width of top guard ring 435 is adjusted such that it extends beyond bottom guard ring 605 and overlaps with bottom electrode 415. The overlap between guard ring 435 and bottom electrode 415 may serve to additionally suppress spurious lateral modes produced at the edges of bottom or top electrode 415 or 430. In addition, when used in combination with an opposite biasing scheme, the overlap may also prevent propagation of spurious modes away from the edge of bottom electrode 415.

With biased top and bottom guard rings 435 and 605, FBAR 700 combines features of FBAR 400 and FBAR 600. In the region where top guard ring 435 overlaps bottom electrode 430, the piezoelectric layer 425 is shorted as in FBAR 400. In the region where the top guard ring 435 overlaps the bottom guard ring 605 the piezoelectric layer 425 is reverse biased compared to direct biased piezoelectric layer 425 in active region, as is FBAR 600.

Figure 7B:
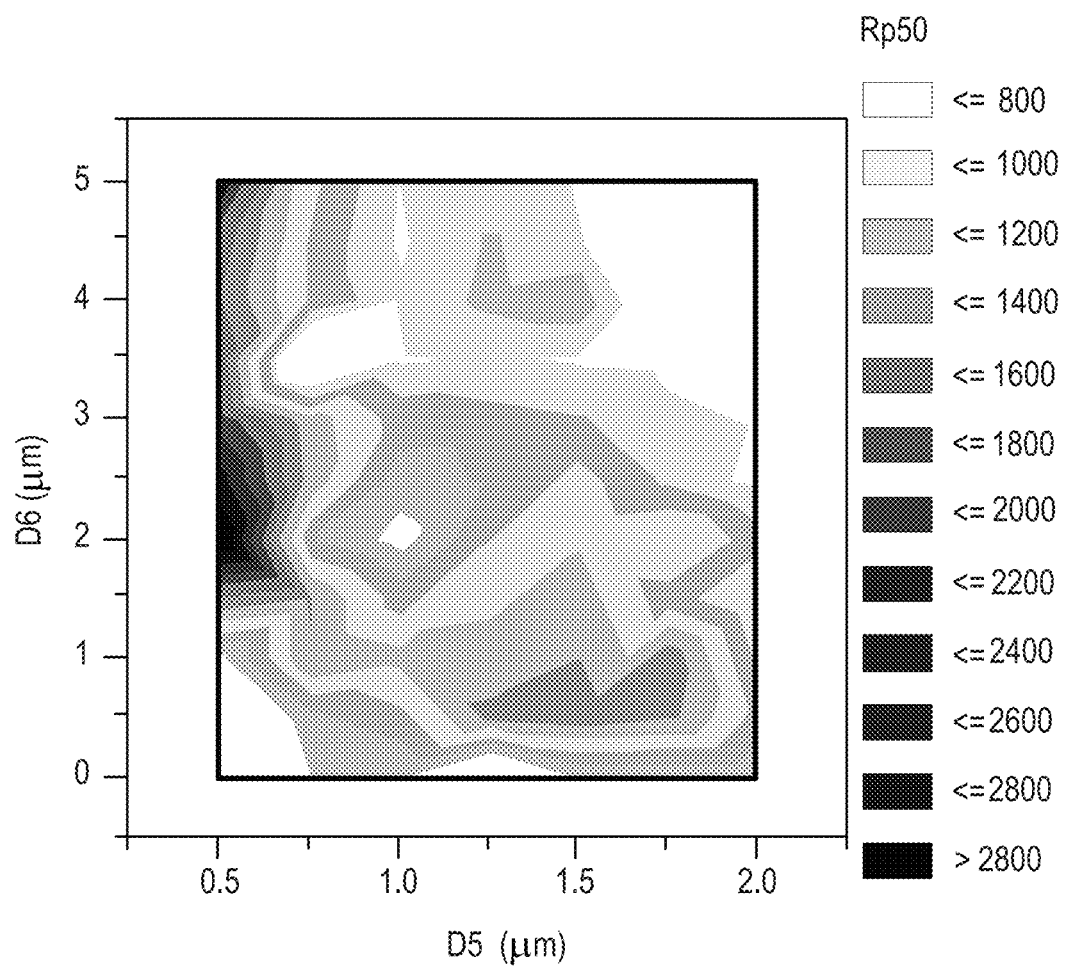
FIG. 7B is a contour plot illustrating the parallel resistance of the FBAR of FIG. 7A as a function of the width and location of a guard ring structure.

FIG. 7B is a contour plot illustrating the parallel resistance of FBAR 700 as a function of the width and location of a guard ring structure. In this example, guard rings 435 and 605 are formed of tungsten and they are electrically floated. In addition, planarization layers 420 and 440 are formed as shown in FIG. 7A, and they are formed of NEBSG. Bottom and top electrodes 415 and 430 are formed of molybdenum.

Referring to FIG. 7B, distance D5 between bottom electrode 415 outer edge and bottom guard ring 605 inner edge is graphed on the x-axis and the width D6 of the bottom guard ring 605 is graphed on the y-axis. Other fixed dimensions in simulation of FBAR 7, shown in FIG. 7A, are: distance between top electrode 430 edge and outer perimeter of cavity 410 is D3=−5 μm, distance between bottom electrode 415 edge and outer perimeter of cavity 410 is D7=−3 μm, width of a top gap TG is D1=0.5 μm, width of an overlap between top guard ring 435 and bottom electrode 415 is D4=0.5 μm. FBAR 700 exhibits the largest values of Rp where the distance D5 between bottom electrode 415 outer edge and bottom guard ring 605 inner edge is approximately 0.5 μm and the width D6 of the bottom guard ring 605 is approximately 2 μm.

Figure 7C:
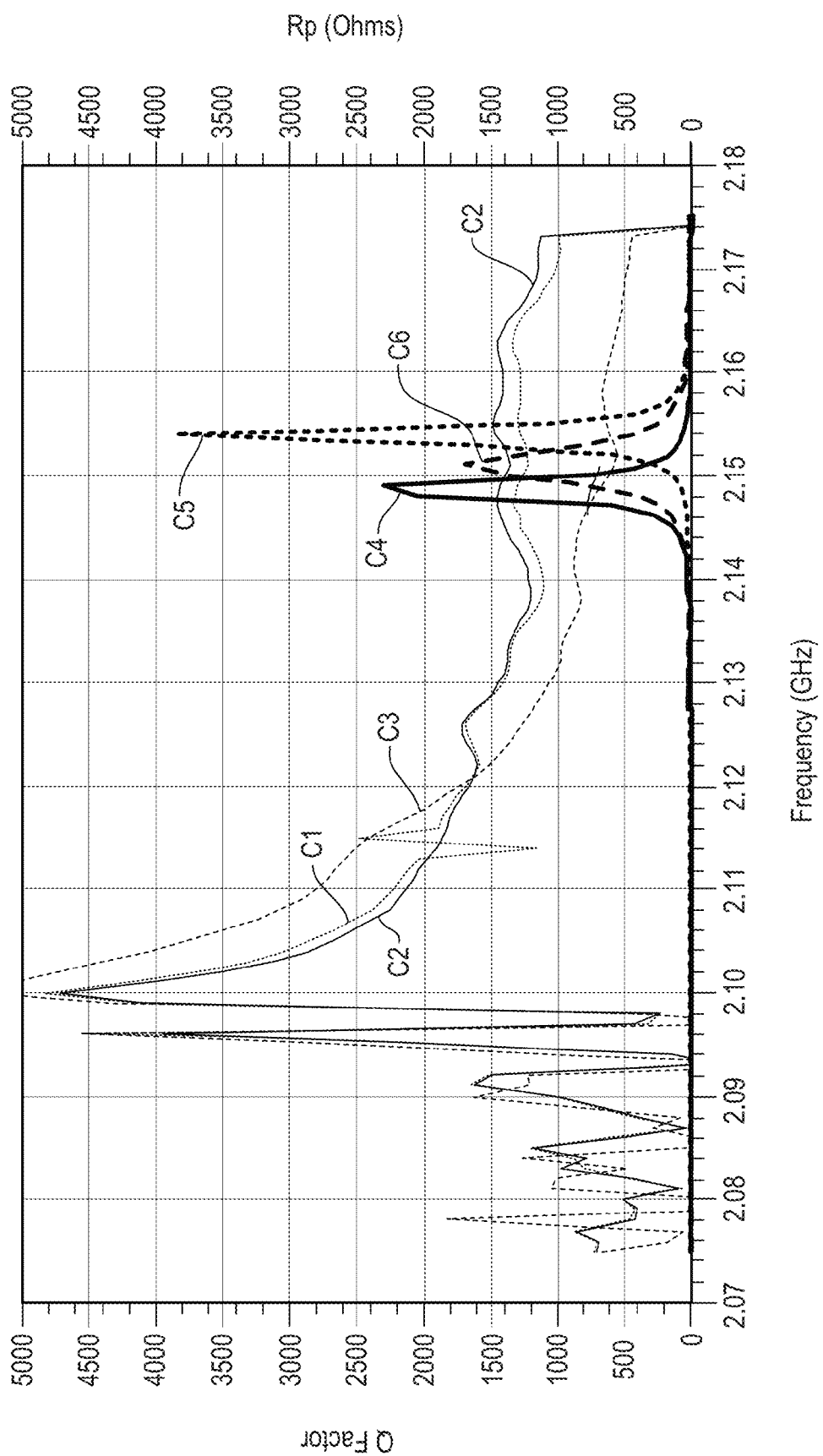
FIG. 7C is a graph illustrating the Q-factor and parallel resistance of the FBAR of FIG. 7A.

FIG. 7C is a graph illustrating the Q-factor and parallel resistance of FBAR 700 shown in FIG. 7A. In FIG. 7C, the Q-factor is represented by a y-axis on the left side, and Rp is represented by a y-axis on the right side. The values of the Q-factor and Rp are shown as a function of the input signal frequency of FBAR 700.

Referring to FIG. 7C, curves C1 and C4 represent a first variation of FBAR 700 in which top guard ring 435 is connected to bottom electrode 415 and the bottom guard ring 605 is connected to top electrode 430 ("hybrid biased GR device"). Curves C2 and C5 represent a second variation in which top and bottom guard rings 435 and 605 are electrically floated ("floating GR device"). Curves C3 and C6 represent a third variation in which top and bottom guard rings 435 and 605 are omitted from FBAR 700 ("reference device"). In the hybrid biased GR device and the floating GR device, the geometry of fixed dimensions (D3, D7, D1 and D4) is the same as for simulations in FIG. 7B. The distance D5 between bottom electrode 415 outer edge and bottom guard ring 605 inner edge is 0.5 μm and the width D6 of the bottom guard ring 605 is 2 μm, which corresponds to the geometry yielding the highest Rp value for floated GR device shown in FIG. 7B. Bottom and top guard rings 605 and 435 are formed of tungsten and bottom and top planarization layers 420 and 440 are formed of NEBSG. Bottom and top electrodes 415 and 430 are formed of molybdenum.

A peak value of the Q-factor occurs for each of the devices at about 2.1 GHz. The Q-value of the reference device is higher than the respective Q-values of the other devices between 2.1 GHz and 2.12 GHz, and it is lower for frequencies higher than 2.12 GHz. A peak value of Rp occurs for the hybrid biased GR device at around 2.149 GHz, for the floated GR device at around 2.154 GHz, and for the reference device at about 2.152 GHz. The floating GR device has the highest Rp value, and it also has relatively larger bandwidth than both the hybrid biased GR and the reference devices. Both the floating GR device and the hybrid biased GR device have higher Rp values than the reference device.

While example embodiments are disclosed herein, one of ordinary skill in the art appreciates that many variations that are in accordance with the present teachings are possible and remain within the scope of the appended claims. One example type of variation may involve combining different features of the above described embodiments, such as mass loading, biasing, overlap, or different materials of one or more guard rings. Another example type of variation may involve adjustment to various parameters such as the values and relative signs (same or opposite) of bias voltages applied to guard rings or electrodes. In view of these and myriad other potential variations, the embodiments are not to be restricted except within the scope of the appended claims.

The invention claimed is:

1. A bulk acoustic wave (BAW) resonator structure, comprising:
    a bottom electrode disposed over a substrate;
    a piezoelectric layer disposed over the bottom electrode;
    a top electrode disposed over the piezoelectric layer;
    a guard ring disposed around a perimeter of an active region corresponding to an overlap of the top electrode, the piezoelectric layer, and the bottom electrode; and
    a planarization layer disposed over the piezoelectric layer and between the top electrode and the guard ring.

2. The BAW resonator structure of claim 1, wherein the guard ring comprises an electrically conductive material disposed over the piezoelectric layer adjacent to the top electrode.

3. The BAW resonator structure of claim 2, wherein the bottom electrode is electrically connected to ground, the top electrode is electrically connected to a time-varying electrical input signal, and the electrically conductive material of the guard ring is electrically connected to ground.

4. The BAW resonator structure of claim 2, wherein the electrically conductive material of the guard ring is electrically connected to the bottom electrode.

5. The BAW resonator structure of claim 2, wherein the electrically conductive material of the guard ring is electrically floated.

6. The BAW resonator structure of claim 2, wherein the electrically conductive material is electrically connected to the top electrode.

7. The BAW resonator structure of claim 1, wherein the planarization layer comprises non-etchable borosilicate glass.

8. The BAW resonator structure of claim 1, wherein the planarization layer comprises a first layer having a first acoustic impedance, and a second layer disposed over the first layer and having a second acoustic impedance lower than the first acoustic impedance.

9. The BAW resonator structure of claim 1, wherein the top electrode comprises a first electrically conductive material having with a first thickness, and the guard ring comprises an electrically conductive material disposed over the piezoelectric layer with a second thickness greater than the first thickness.

10. The BAW resonator structure of claim 1, wherein the top electrode comprises a first electrically conductive material having a first acoustic velocity, and the guard ring comprises a second electrically conductive material disposed over the piezoelectric layer and having a second acoustic velocity lower than the first acoustic velocity.

11. The BAW resonator structure of claim 10, wherein the first electrically conductive material is molybdenum and the second electrically conductive material is tungsten.

12. The BAW resonator structure of claim 1, wherein the guard ring is a first guard ring, which is disposed over a first side of the piezoelectric layer around a perimeter of the top electrode, and the BAW resonator structure further comprises:
    a second guard ring disposed beneath a second side of the piezoelectric layer around a perimeter of the bottom electrode.

13. The BAW resonator structure of claim 12, wherein the bottom and top electrodes have substantially aligned edges, and the first and second guard rings have substantially aligned edges.

14. The BAW resonator structure of claim 12, wherein the second guard ring overlaps the bottom electrode.

15. The BAW resonator structure of claim 12, wherein the first guard ring is electrically connected to the top electrode and the second guard ring is electrically connected to the bottom electrode.

16. The BAW resonator structure of claim 12, wherein the first guard ring comprises molybdenum and the second guard ring comprises tungsten.

17. The BAW resonator structure of claim 1, further comprising a cavity disposed in the substrate within the active region, wherein the bottom electrode is suspended over the cavity.

18. The BAW resonator structure of claim 1, wherein the guard ring comprises a dielectric material or a composite of metal and dielectric materials.

19. The BAW resonator structure of claim 1, wherein the guard ring is configured to reduce a cutoff frequency in a region around the perimeter of the active region.

20. A bulk acoustic wave (BAW) resonator structure, comprising:
a bottom electrode disposed over a substrate;
a piezoelectric layer disposed over the bottom electrode;
a top electrode disposed over the piezoelectric layer, the top electrode comprising
a first electrically conductive material having with a first thickness;
a guard ring disposed around a perimeter of an active region corresponding to an overlap of the bottom electrode, the piezoelectric layer, and the top electrode, the guard ring comprising an electrically conductive material disposed over the piezoelectric layer with a second thickness greater than the first thickness, wherein the guard ring comprises a composite of metal and dielectric materials.

21. A bulk acoustic wave (BAW) resonator structure, comprising:
a bottom electrode disposed over a substrate, and electrically connected to ground;
a piezoelectric layer disposed over the bottom electrode;
a top electrode disposed over the piezoelectric layer, the top electrode comprising a first electrically conductive material having a first thickness, and electrically configured to receive a time-varying input signal;
a guard ring disposed over the piezoelectric layer adjacent to the top electrode, and around a perimeter of an active region corresponding to an overlap of the bottom electrode, the piezoelectric layer, and the top electrode, the guard ring comprising an electrically conductive material electrically connected to ground, and disposed over the piezoelectric layer with a second thickness greater than the first thickness.

22. The BAW resonator structure of claim 21, further comprising a cavity disposed in the substrate within the active region, wherein the bottom electrode is suspended over the cavity.

23. The BAW resonator structure of claim 21, wherein the guard ring comprises a composite of metal and dielectric materials.

24. The BAW resonator structure of claim 21, wherein the electrically conductive material of the guard ring is electrically connected to the bottom electrode.

25. The BAW resonator structure of claim 21, wherein the guard ring is a first guard ring, which is disposed over a first side of the piezoelectric layer around a perimeter of the top electrode, and the BAW resonator structure further comprises:
a second guard ring disposed beneath a second side of the piezoelectric layer around a perimeter of the bottom electrode.

26. The BAW resonator structure of claim 25, wherein the first guard ring comprises molybdenum and the second guard ring comprises tungsten.

27. The BAW resonator structure of claim 25, wherein the bottom and top electrodes have substantially aligned edges, and the first and second guard rings have substantially aligned edges.

28. The BAW resonator structure of claim 25, wherein the second guard ring overlaps the bottom electrode.

29. The BAW resonator structure of claim 25, wherein the first guard ring is electrically connected to the top electrode and the second guard ring is electrically connected to the bottom electrode.

30. A bulk acoustic wave (BAW) resonator structure, comprising:
a bottom electrode disposed over a substrate;
a piezoelectric layer disposed over the bottom electrode;
a top electrode disposed over the piezoelectric layer, the top electrode comprising a first electrically conductive material having a first thickness;
a first guard ring disposed over a first side of the piezoelectric layer around a perimeter of the top electrode, and around a perimeter of an active region corresponding to an overlap of the bottom electrode, the piezoelectric layer, and the top electrode, the first guard ring comprising an electrically conductive material disposed over the piezoelectric layer with a second thickness greater than the first thickness; and
a second guard ring disposed beneath a second side of the piezoelectric layer around a perimeter of the bottom electrode, wherein the first and top electrodes have substantially aligned edges, and the first and second guard rings have substantially aligned edges.

31. The BAW resonator structure of claim 30, wherein the second guard ring overlaps the bottom electrode.

32. The BAW resonator structure of claim 30, wherein the first guard ring is electrically connected to the top electrode and the second guard ring is electrically connected to the bottom electrode.

33. The BAW resonator structure of claim 30, wherein the first guard ring comprises molybdenum and the second guard ring comprises tungsten.

34. A bulk acoustic wave (BAW) resonator structure, comprising:
a bottom electrode disposed over a substrate;
a piezoelectric layer disposed over the bottom electrode;
a top electrode disposed over the piezoelectric layer, the top electrode comprising a first electrically conductive material having a first acoustic velocity;
a guard ring disposed around a perimeter of an active region corresponding to an overlap of the bottom electrode, the piezoelectric layer, and the top electrode, the guard ring comprising a second electrically conductive material disposed over the piezoelectric layer and having a second acoustic velocity lower than the first acoustic velocity.

35. The BAW resonator structure of claim 34, wherein the bottom electrode is electrically connected to ground, the top electrode is electrically connected to a time-varying electrical input signal, and the second electrically conductive material is electrically connected to ground.

36. The BAW resonator structure of claim 34, wherein the second electrically conductive material of the guard ring is electrically connected to the bottom electrode.

37. The BAW resonator structure of claim 34, wherein the second electrically conductive material of the guard ring is electrically floated.

38. The BAW resonator structure of claim 34, wherein the guard ring is a first guard ring, which is disposed over a first side of the piezoelectric layer around a perimeter of the top electrode, and the BAW resonator structure further comprises:
a second guard ring disposed beneath a second side of the piezoelectric layer around a perimeter of the bottom electrode.

39. The BAW resonator structure of claim 38, wherein the bottom and top electrodes have substantially aligned edges, and the first and second guard rings have substantially aligned edges.

40. The BAW resonator structure of claim 38, wherein the second guard ring overlaps the bottom electrode.

41. The BAW resonator structure of claim 38, wherein the first guard ring is electrically connected to the top electrode and the second guard ring is electrically connected to the bottom electrode.

42. The BAW resonator structure of claim 38, wherein the first guard ring comprises molybdenum and the second guard ring comprises tungsten.

43. The BAW resonator structure of claim 38, further comprising a cavity disposed in the substrate within the active region, wherein the bottom electrode is suspended over the cavity.

44. The BAW resonator structure of claim 38, wherein the guard ring comprises a composite of metal and dielectric materials.

45. The BAW resonator structure of claim 34, wherein the guard ring is disposed over the piezoelectric layer adjacent to the top electrode.

* * * * *